(12) United States Patent
Syed et al.

(10) Patent No.: US 12,527,003 B2
(45) Date of Patent: Jan. 13, 2026

(54) MEMORY DEVICE WITH REDUCED THRESHOLD VOLTAGE

(71) Applicant: International Business Machines Corporation, Armonk, NY (US)

(72) Inventors: Ghazi Sarwat Syed, Kilchberg (CH); Timothy Mathew Philip, Albany, NY (US); Vara Sudananda Prasad Jonnalagadda, Wallisellen (CH); Abu Sebastian, Adliswil (CH); Matthew Joseph BrightSky, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 388 days.

(21) Appl. No.: 18/217,648

(22) Filed: Jul. 3, 2023

(65) Prior Publication Data

US 2025/0017023 A1 Jan. 9, 2025

(51) Int. Cl.
| H10B 63/10 | (2023.01) |
| H10B 63/00 | (2023.01) |
| H10N 70/00 | (2023.01) |
| H10N 70/20 | (2023.01) |

(52) U.S. Cl.
CPC ............. *H10B 63/10* (2023.02); *H10B 63/24* (2023.02); *H10N 70/011* (2023.02); *H10N 70/231* (2023.02); *H10N 70/8413* (2023.02)

(58) Field of Classification Search
CPC ...... H10B 63/10; H10B 63/24; H10N 70/011; H10N 70/231; H10N 70/8413; H10N 70/20; H10N 70/253; H10N 70/821; H10N 70/8828

See application file for complete search history.

(56) References Cited

U.S. PATENT DOCUMENTS

| 7,800,092 B2 * | 9/2010 | Liu .................. H10N 70/253 |
| | | 257/E47.001 |
| 8,022,382 B2 | 9/2011 | Lai et al. |
| 10,892,413 B2 | 1/2021 | Bruce et al. |
| 11,152,569 B2 | 10/2021 | Wu |

(Continued)

OTHER PUBLICATIONS

Xu et al, "Lower current operation of phase change memory cell with a thin TiO2 layer", Citation: Applied Physics Letters 92, 062103 (2008); doi: 10.1063/1.2841655, Published Date: Feb. 12, 2008, 4 Pages. http://dx.doi.org/10.1063/1.2841655.

(Continued)

*Primary Examiner* — Allison Bernstein
(74) *Attorney, Agent, or Firm* — SCULLY, SCOTT, MURPHY & PRESSER, P.C.; Yuanmin Cai

(57) ABSTRACT

Semiconductor devices and methods for forming the semiconductor devices are described. A semiconductor device can include a first electrode, a storage node, a second electrode and a film layer. The storage node can include phase change material deposited on top of the first electrode. The film layer can be deposited on top of the storage node and connected in a closed circuit. A voltage difference among the first electrode, the second electrode and the film layer can dictate a threshold voltage that triggers a phase change of the phase change material. An amorphous volume in the storage node can be dependent on a structural arrangement of the first electrode, the second electrode and the film layer with respect to the storage node.

20 Claims, 15 Drawing Sheets

(56) References Cited

U.S. PATENT DOCUMENTS

| | | |
|---|---|---|
| 11,707,004 B2 * | 7/2023 | Yuan .................. H10N 70/8828 |
| 2007/0189065 A1 | 8/2007 | Suh et al. |
| 2015/0243884 A1 * | 8/2015 | BrightSky ............ H10N 70/826 |
| | | 257/4 |

OTHER PUBLICATIONS

Yu et al, "Minimum Voltage for Threshold Switching in Nanoscale Phase-Change Memory",Cite this: Nano Lett. 2008, 8, 10, 3429-3433, Publication Date: Sep. 4, 2008, 5 Pages. https://pubs.acs.org/doi/full/10.1021/nl802261s.

Krebs et al, "Threshold field of phase change memory materials measured using phase change bridge devices" Appl. Phys. Lett. 95, 082101 (2009), published online Aug. 24, 2009. 4 Pages. https://doi.org/10.1063/1.3210792.

* cited by examiner

MEMORY DEVICE WITH REDUCED THRESHOLD VOLTAGE

BACKGROUND

The present disclosure relates in general to semiconductor devices and methods of manufacturing semiconductor devices and, in particular, to phase change memory devices with a reduced threshold voltage.

Phase change materials can change phase between an amorphous state and a crystalline state by application of specific levels of electrical current or voltage. The amorphous state can be characterized by a relatively higher electrical resistivity than the crystalline state, causing different levels of voltages or current being used for setting the phase of the phase change material. A phase change memory (PCM) device can use phase change material to increase memory capacity. In an aspect, different voltage or current levels can be applied to alter the phase change material such that the PCM device can vary among an OFF or RESET state (e.g., fully amorphous), an ON or SET state (e.g., fully crystalline), and intermediate states that represent different degrees of partial crystallization. Thus, PCM devices can be capable of storing more than two bits of information.

SUMMARY

In one embodiment, a semiconductor device is generally described. The semiconductor device can include a first electrode, a storage node, a second electrode and a film layer. The storage node can include phase change material deposited on top of the first electrode. The film layer can be deposited on top of the storage node and connected in a closed circuit. A voltage difference among the first electrode, the second electrode and the film layer can dictate a threshold voltage that triggers a phase change of the phase change material. An amorphous volume in the storage node can be dependent on a structural arrangement of the first electrode, the second electrode and the film layer with respect to the storage node.

In one embodiment, a memory device is generally described. The memory device can include a plurality of memory elements. Each memory element among the plurality of memory elements can include a memory cell. The memory cell can include a first electrode, a storage node, a second electrode and a film layer. The storage node can include phase change material deposited on top of the first electrode. The film layer can be deposited on top of the storage node and connected in a closed circuit. A voltage difference among the first electrode, the second electrode and the film layer can dictate a threshold voltage that triggers a phase change of the phase change material. An amorphous volume in the storage node can be dependent on a structural arrangement of the first electrode, the second electrode and the film layer with respect to the storage node.

In one embodiment, a method for forming a memory cell is generally described. The method can include forming a first electrode. The method can further include depositing a layer of phase change material. The method can further include depositing a film layer. The method can further include forming a second electrode. The method can further include connecting the first electrode and the second electrode to a voltage source. The method can further include connecting the film layer to a closed circuit to define a threshold voltage that triggers a phase change of the phase change material.

Further features as well as the structure and operation of various embodiments are described in detail below with reference to the accompanying drawings. In the drawings, like reference numbers indicate identical or functionally similar elements.

DETAILED DESCRIPTION

Figure 1A:
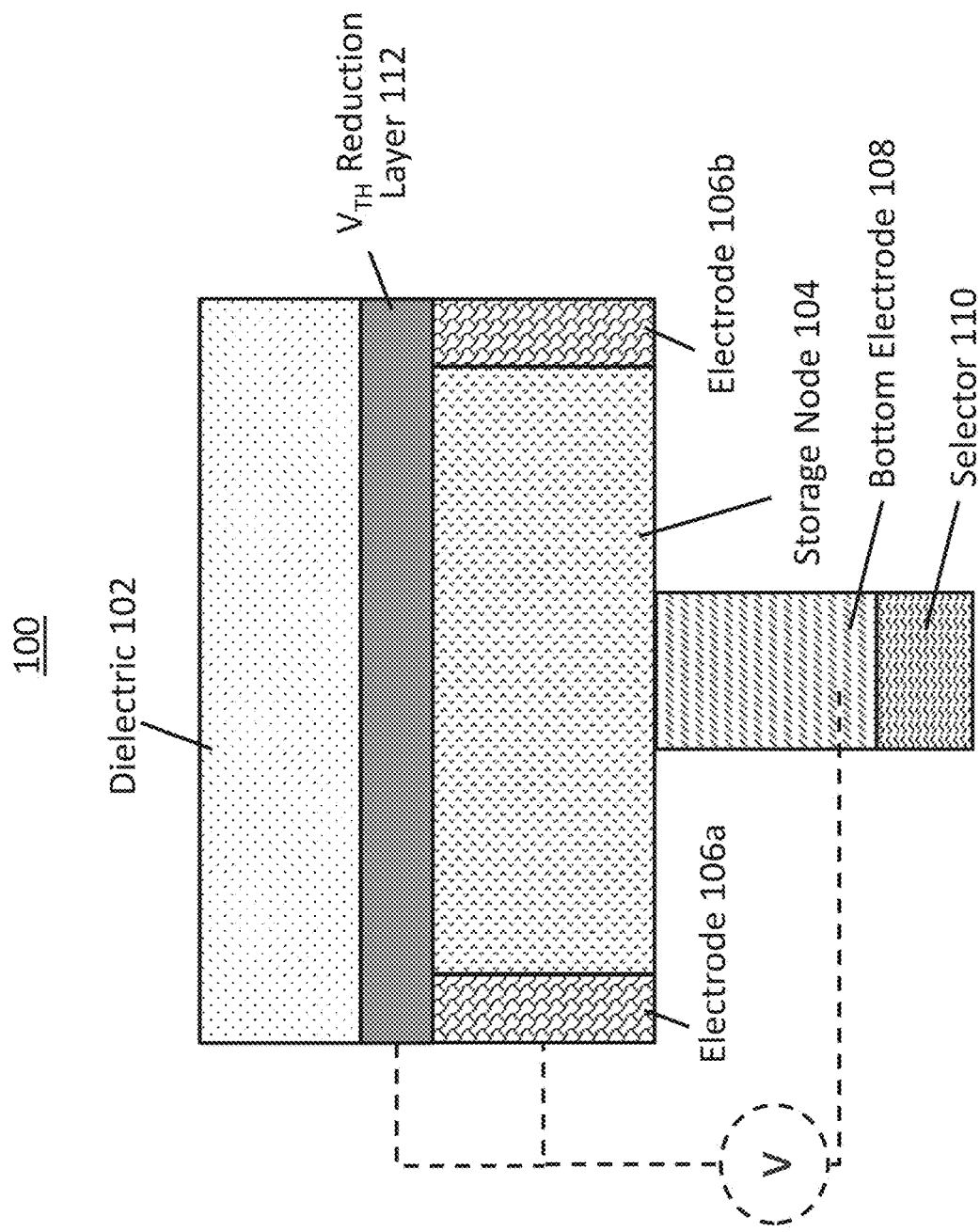
FIG. 1A is a diagram illustrating a cross sectional view of a memory cell with reduced threshold voltage in one embodiment.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following descriptions, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

In an aspect, a parameter governing the transition of a selector (e.g., chalcogenide selector) of a PCM device from the OFF (or RESET) state to the ON (or SET) state, and the transition of the PCM device from the amorphous (or RESET) state to crystalline (e.g., SET) state occurs at a threshold voltage ($V_{TH}$). Threshold voltage $V_{TH}$ can be a minimum voltage required to switch a selector or the PCM device from the OFF state to the ON state. In multi-level PCM cells and analog computational memory devices, threshold voltages are non-trivial (owing to the choice of material and large amorphous volumes). Multiple access transistors, attached in series, are typically required in accessing PCM devices. Access transistors can act as switches to enable the selection of a specific memory cell for data retrieval or modification. The voltage distribution between the access transistors ensures that no access transistor is over driven in the state of high field and potential breakdown. Large threshold voltages can increase the power dissipation, while the use of multiple access transistors can increase the areal complexity (e.g., inefficiencies). Therefore, it is desirable to decrease the threshold voltages in the devices.

FIG. 1A is a cross sectional view of a memory cell with reduced threshold voltage in one embodiment. A semiconductor device, or memory cell 100, is shown in FIG. 1A. Memory cell 100 can be a PCM-based non-volatile memory cell. Memory cell 100 can include components arranged in a stack configuration, such as at least a dielectric 102, a storage node 104, a first electrode or bottom electrode 108, one or more second electrodes such as electrodes 106a, 106b, and a selector node 110. In an example shown in FIG. 1A, storage node 104 can be stacked on top of bottom electrode 108. Bottom electrode 108 can include conductive materials such as titanium nitride (TiN), tungsten (W), tungsten nitride (WN), silver (Ag), platinum (Pt), palladium (Pd), or aluminum (Al). Bottom electrode 108 can include a single layered structure composed entirely of one conductive material or a multilayered structure containing at least two different conductive materials in a stacked configuration. Bottom electrode 108 can be arranged on top of a selector node 110. Selector node 110 can be electrically coupled to storage node 104 through bottom electrode 108. Selector node 110 can include components such as diodes, threshold switching devices, and/or other components. Selector node 110 can be used for isolating and controlling the flow of current to memory cell 100 within a memory array during read and write operations. Selector node 110 can ensure that only memory cell 100 receives the appropriate voltage or current required for reading or programming, while isolating neighboring memory cells to prevent disturbances or unintended modifications.

Additional electrode can be arranged on top of, or to the sides of, storage node 104. In the example shown in FIG. 1A, electrodes 106a, 106b can be arranged on a perimeter or sides of storage node 104. Electrodes 106a, 106b can be composed of conductive materials such as titanium nitride (TiN), tungsten (W), tungsten nitride (WN), silver (Ag), platinum (Pt), palladium (Pd), or aluminum (Al). A dielectric 102 can be arranged, directly (e.g., attached without intervening layers) or indirectly (e.g., with intervening layers), above storage node 104. Dielectric 102 can be composed of, for example, dielectric materials including but not limited to silicon nitride, silicon carbide nitride, or other types of dielectric materials. Dielectric 102 can provide electrical insulation between memory cell 100 and interconnects connecting memory cell 100 to other circuits.

Storage node 104 can include phase change materials such as germanium-antimony-tellurium (GST) alloy, an antimony-tellurium (SbTe) alloy, or an indium selenide (InSe) alloy. In an aspect, data is stored in memory cell 100 by using the electrical resistance contrast between a high conductive crystalline phase and a low conductive amorphous phase of the phase change material in storage node 104. Data stored in memory cell 100 can be retrieved by measuring the electrical resistance of memory cell 100.

In an aspect, the amorphous phase of the phase change material in storage node 104 is a thermodynamically unstable glass. Bottom electrode 108 can include a heating element that can be activated by a voltage V. When the phase change material in amorphous phase is heated, by bottom electrode 108, to a temperature above its crystallization point, but below its melting temperature, it will transform into a crystalline phase (e.g., low resistance state). To transform the material back to the amorphous phase, the phase change material needs to be heated, by bottom electrode 108, to a temperature above its melting temperature and then rapidly cooled down. This rapid cooldown can freeze the atomic structure in a disordered state thus transitioning the phase change material back to amorphous phase (e.g., high resistance state).

An electrical pulse used for switching memory cell 100 to the high-resistance amorphous phase can be referred to as RESET pulse, and the pulse used for switching memory cell 100 to the low-resistance crystalline phase can be referred to as SET pulse. The RESET and SET pulses can be provided to memory cell 100 as voltage V. To transition the amorphous phase to the crystalline phase, voltage V needs to exceed threshold voltage $V_{TH}$.

In PCM devices, threshold voltage $V_{TH}$ can scale with the size of the amorphous volume ($u_a$), meaning the amorphous volume $u_a$ increases as threshold voltage $V_{TH}$ increases. Threshold voltage $V_{TH}$ is also a property of the phase change material ascribed to the parameter threshold electric field $F_{TH}$, and the threshold voltage can be approximated as $V_{TH} = F_{TH} \times u_a$. In an aspect, if an electric field formed in storage node 104 is non-uniform, relatively small electric fields can be formed in scattered regions in storage node 104 and these scattered electric fields can become larger than threshold electric field $F_{TH}$. Hence, threshold voltage $V_{TH}$ may need to be higher in order to create uniform electric field that increases the amorphous volume. However, when voltage V exceeds threshold voltage $V_{TH}$, voltage V can continue to increase and gradually increases at an exponential rate. In an aspect, when memory cell 100 is in ON state, access transistors connected to memory cell 100 may be driven to access data stored in memory cell 100. If threshold voltage $V_{TH}$ is set to a greater value, then the exponential increase of V can reach a level that overdrives the access transistors relatively faster when compared to a lower threshold voltage $V_{TH}$. Therefore, high threshold voltage $V_{TH}$ can increase the risk of overdriving the access transistors.

To reduce threshold voltage $V_{TH}$ while increasing amorphous volume $u_a$, a film layer labeled as threshold voltage reduction layer 112 can be positioned in memory cell 100 to reduce threshold voltage $V_{TH}$ and change a distribution of the electric field generated by voltage V inside storage node 104. The change of the distribution of the electric field can change (e.g., increase and/or concentrate) the amorphous volume $u_a$. Threshold voltage reduction layer 112 can be arranged in memory cell 100 such that threshold voltage reduction layer 112 is parallel to bottom electrode 108 and is on an opposing surface of storage node 104 when compared to bottom electrode 108. Further, threshold voltage reduction layer 112 can be arranged in memory cell 100 such that storage node 104 is bounded by threshold voltage reduction layer 112, bottom electrode 108 and electrodes 106a, 106b. By way of example, threshold voltage reduction layer 112 in FIG. 1A is placed on a top surface of storage node 104 and bottom electrode 108 is on an opposing surface, such as the bottom surface, of storage node 104. In the example shown in FIG. 1A, threshold voltage reduction layer 112 can be an intervening layer between threshold voltage reduction layer 112 and storage node 104. Threshold voltage reduction layer 112 can be a thin film that is back-end-of-line (BEOL) and PCM device compatible. By way of example, threshold voltage reduction layer 112 can be a thin film of metal nitride (e.g., titanium nitride (TiN), tantalum nitride (TaN)), undoped or doped amorphous carbon, or other materials that are BEOL and PCM compatible.

By way of example, bottom electrode 108 can be a drain terminal of memory cell 100, and electrodes 106a, 106b can be a source terminal of memory cell 100. Threshold voltage reduction layer 112 can be a conductive layer. In order to create a potential difference or voltage difference across threshold voltage reduction layer 112, an electrical connection needs to be established to connect threshold voltage reduction layer 112 in a closed electrical circuit. In one embodiment, threshold voltage reduction layer 112 can be connected to the source and drain terminals (e.g., electrodes 106a, 106b and bottom electrode 108) of memory cell 100 to form a closed circuit. In some embodiments, threshold voltage reduction layer 112 can be connected to ground or to a voltage source (e.g., voltage V). The electrical connection of threshold voltage reduction layer 112 in a closed circuit allows threshold voltage reduction layer 112 to contribute to a voltage difference across memory cell 100 and reduce threshold voltage $V_{TH}$. The connection of threshold voltage reduction layer 112 in a closed circuit can cause a phase change in storage node 104 to be triggered relatively faster or earlier, thus reducing threshold voltage $V_{TH}$.

Figure 1B:
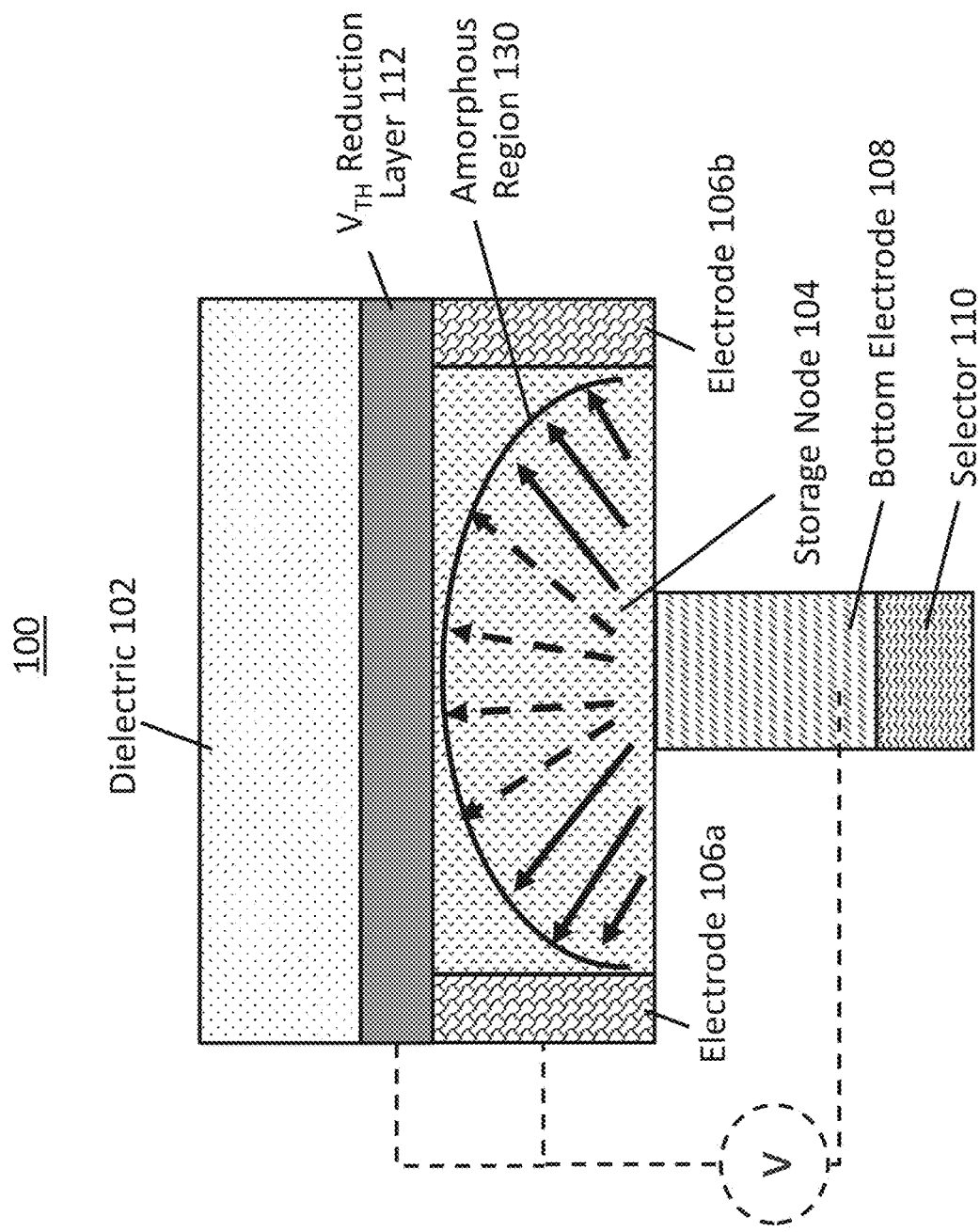
FIG. 1B is a diagram illustrating an electric field in a memory cell with reduced threshold voltage in one embodiment.

Further, the position of the threshold reduction layer 112, in memory cell 100, with respect to the bottom electrode 108 and other electrodes (e.g., electrodes 106a, 106b in FIG. 1) can change the distribution of electric field generated by voltage V. Referring to an example shown in FIG. 1B, amorphous volume $u_a$ of an amorphous region 130 can be defined by an electric field generated by voltage V. In the example in FIG. 1B, solid arrows in the amorphous region 130 represent charges moving from bottom electrode 108 towards electrodes 106a, 106b and dotted arrows represent charges moving from bottom electrode 108 towards threshold voltage reduction layer 112. Without threshold voltage reduction layer 112, an electric field formed by charges moving toward electrodes 106a, 106b (e.g., solid arrows) can cause amorphous region 130 to be scattered with a non-uniform shape. Having threshold voltage reduction layer 112 connected in a closed circuit allows the electric field to point from the bottom electrode 108 toward threshold voltage reduction layer 112. Therefore, threshold voltage reduction layer 112 can reduce threshold voltage $V_{TH}$ and change the distribution of the electric field generated by voltage V to change the size (e.g., amorphous volume) of switchable amorphous volume 130. Note that as the amorphous volume $u_a$ increases, the threshold voltage per unit volume decreases.

In an aspect, nonidealities of PCM devices such as temporal variations in the electrical resistance have a detrimental impact on computational precision. To address such nonidealities, the phase configuration of the phase change material can be projected onto some stable element within the PCM device. The projection can involve decoupling the readout characteristics of the PCM device from the noisy electrical properties of the phase change material. By way of example, a conductive liner or a projection layer, can be placed in parallel to the phase-change material such that the PCM device read-out characteristics become dictated by the properties of the projection layer.

In the example shown in FIG. 1A, memory cell 100 is an unprojected PCM memory cell (e.g., without the projection layer). For unprojected PCM devices such as memory cell 100, in each resistance state (e.g., high resistive amorphous phase and low resistive crystalline phase), the resistance of threshold voltage reduction layer 112 ($R_{VTH}$) is less than the resistance of the amorphous phase ($R_a$) but greater than the resistance of the crystalline phase ($R_c$). In other words, $R_a > R_{VTH} > R_c$. By way of example, $R_a = \beta \times R_{VTH}$ and $R_c = \alpha \times R_{VTH}$, where $\alpha < \beta$. In one embodiment, the electrical resistance or resistivity of threshold voltage reduction layer 112 can be tuned to a target electrical resistivity using thickness control, material selection, doping, thermal annealing, or other techniques.

Advantageously, the addition of threshold voltage reduction layer described herein in memory cells can reduce threshold voltage of the memory cells while causing electric field in storage nodes to be uniformed such that a size of amorphous region in storage node 104 can be increased. Further, the concept of adding threshold voltage reduction layer can be extended to other types of devices, such as selector devices that include phase change materials (e.g., chalcogenide selectors). For projected PCM memory devices, the threshold voltage reduction layer can improve the projection efficacy. Furthermore, the addition of threshold voltage reduction to alter threshold voltage and amorphous region size can avoid scaling in the dimension of the existing PCM devices and/or changes in the choice of phase change material.

Figure 2:
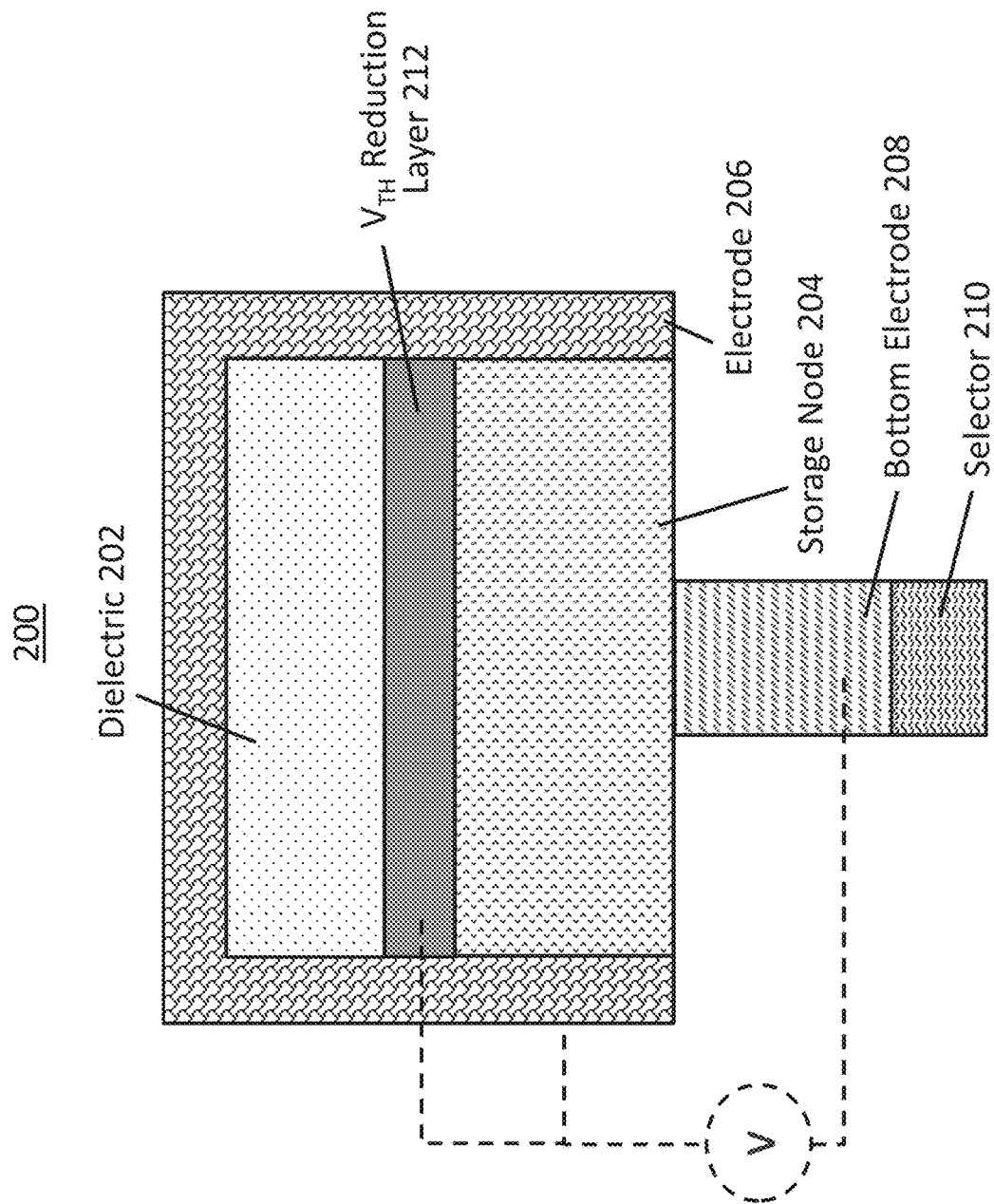
FIG. 2 is a diagram illustrating a cross sectional view of another memory cell with reduced threshold voltage in one embodiment.

FIG. 2 is a diagram illustrating a cross sectional view of another memory cell with reduced threshold voltage in one embodiment. Another semiconductor device, or memory cell 200, is shown in FIG. 2. Memory cell 200 can be a PCM-based non-volatile memory cell. Memory cell 200 can include components arranged in a stack configuration, such as at least a dielectric 202, a storage node 204, a first electrode or bottom electrode 208, one or more second electrodes such as an electrode 206, and a selector node 210. Storage node 204 can be stacked on top of bottom electrode 208. Bottom electrode 208 can be the same as bottom electrode 108 shown in FIG. 1A, or other bottom electrodes described herein. Storage node 204 can be the same as storage node 104 shown in FIG. 1A, or other storage nodes described herein. Selector node 210 can be electrically coupled to storage node 204 through bottom electrode 208. Selector node 210 be the same as selector 110 shown in FIG. 1A, or other selector nodes described herein.

Electrode 206 can be disposed on top of dielectric 202, on the sides of dielectric 202, the on the sides of storage node 204. Electrode 206 can be composed of the same materials as electrodes 106a, 106b shown in FIG. 1A, or other electrodes described herein. To reduce threshold voltage $V_{TH}$ while increasing amorphous volume $u_a$, a film layer labeled as threshold voltage reduction layer 212 can be positioned in memory cell 200 to reduce threshold voltage $V_{TH}$ and change a distribution of the electric field generated by voltage V inside storage node 204. Threshold voltage reduction layer 212 can be composed of the same materials as threshold voltage reduction layer 112 shown in FIG. 1A, or other threshold voltage reduction layers described herein. Storage node 204 can be bounded by bottom electrode 208, electrode 206 and threshold voltage reduction layer 212.

The position of the threshold reduction layer 212, in memory cell 200, with respect to the bottom electrode 208 and electrode 206 can change the distribution of electric field generated by voltage V. By way of example, charges of an electric field being generated in storage node 204 can move from bottom electrode 208 towards electrode 206 on the sides and also toward threshold voltage reduction layer 212. Without threshold voltage reduction layer 212, charges of the electric field being formed in storage node 204 may move toward electrode 206 on the sides and also through dielectric 202, which may create scattered and small amorphous regions having non-uniform shape. Threshold voltage reduction layer 212 can reduce the area in which the charges flow thus creating a relatively mode uniform amorphous region.

Figure 3:
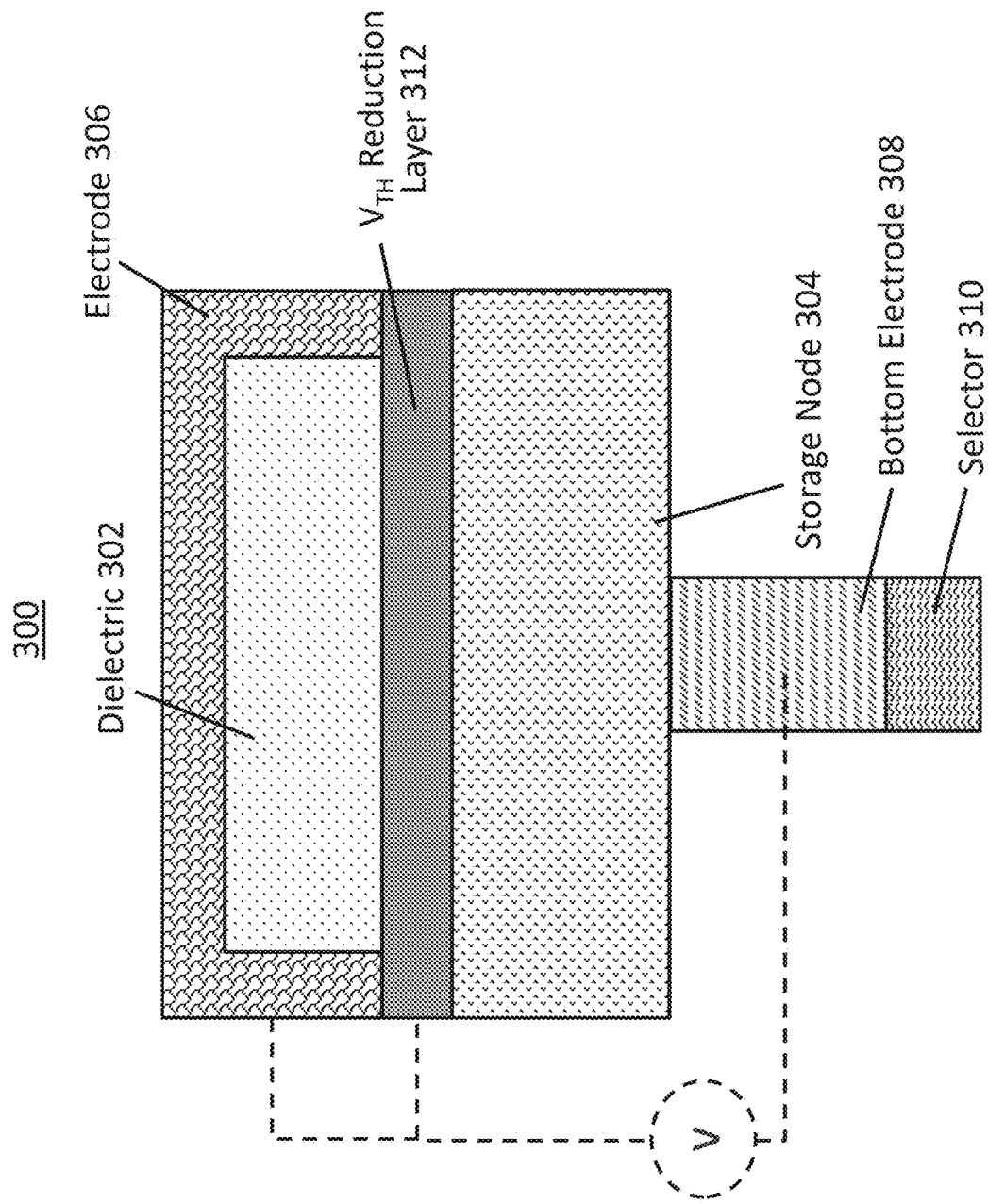
FIG. 3 is a diagram illustrating a cross sectional view of another memory cell with reduced threshold voltage in one embodiment.

FIG. 3 is a diagram illustrating a cross sectional view of another memory cell with reduced threshold voltage in one embodiment. Another semiconductor device, or memory cell 300, is shown in FIG. 3. Memory cell 300 can be a PCM-based non-volatile memory cell. Memory cell 300 can include components arranged in a stack configuration, such as at least a dielectric 302, a storage node 304, a first electrode or bottom electrode 308, one or more second electrodes such as an electrode 306, and a selector node 310. Storage node 304 can be stacked on top of bottom electrode 308. Bottom electrode 308 can be the same as bottom electrode 108 shown in FIG. 1A, or other bottom electrodes described herein. Storage node 304 can be the same as storage node 104 shown in FIG. 1A, or other storage nodes described herein. Selector node 310 can be electrically coupled to storage node 304 through bottom electrode 308. Selector node 310 be the same as selector 110 shown in FIG. 1A, or other selector nodes described herein.

Electrode 306 can be disposed on top of dielectric 302 and on the sides of dielectric 302. Electrode 306 can be disconnected from storage node 304. Electrode 306 can be composed of the same materials as electrodes 106a, 106b shown in FIG. 1A, or other electrodes described herein. To reduce threshold voltage $V_{TH}$ while increasing amorphous volume $u_a$, a film layer labeled as threshold voltage reduction layer 312 can be positioned in memory cell 300 to reduce threshold voltage $V_{TH}$ and change a distribution of the electric field generated by voltage V inside storage node 304. Threshold voltage reduction layer 312 can be composed of the same materials as threshold voltage reduction layer 112 shown in FIG. 1A, or other threshold voltage reduction layers described herein. Storage node 304 can be bounded by bottom electrode 308 and threshold voltage reduction layer 312.

The position of the threshold reduction layer 312, in memory cell 300, with respect to the bottom electrode 308 and electrode 306 can change the distribution of electric field generated by voltage V. By way of example, charges of an electric field being generated in storage node 304 can flow from bottom electrode 308 towards threshold voltage reduction layer 312. Without threshold voltage reduction layer 312, charges of the electric field being formed in storage node 304 may flow toward electrode 306 through dielectric 302, which may create scattered and small amorphous regions having non-uniform shape. Threshold voltage reduction layer 312 can reduce the area in which the charges flow thus creating a relatively mode uniform amorphous region.

Figure 4:
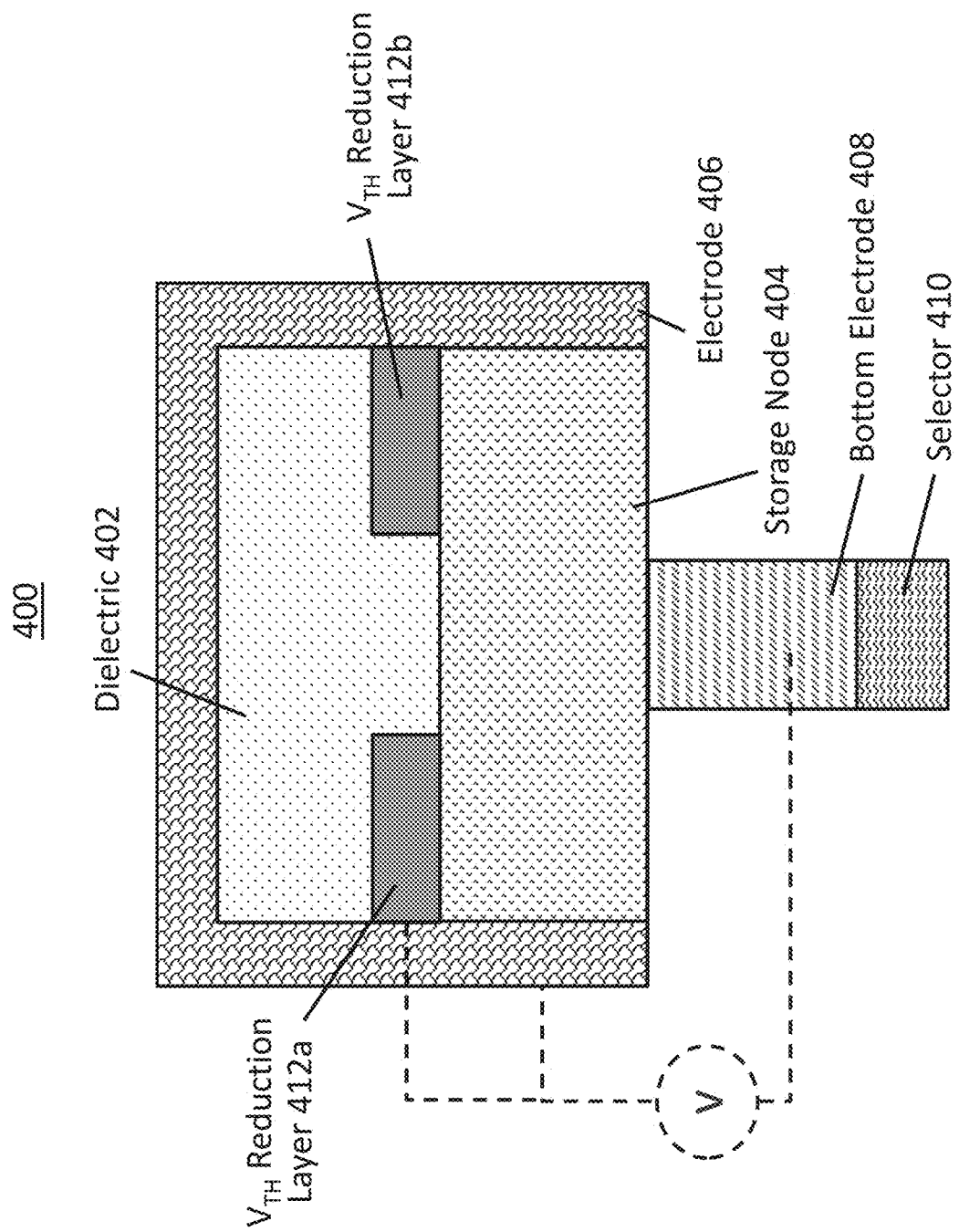
FIG. 4 is a diagram illustrating a cross sectional view of another memory cell with reduced threshold voltage in one embodiment.

FIG. 4 is a diagram illustrating a cross sectional view of another memory cell with reduced threshold voltage in one embodiment. Another semiconductor device, or memory cell 400, is shown in FIG. 4. Memory cell 400 can be a PCM-based non-volatile memory cell. Memory cell 400 can include components arranged in a stack configuration, such as at least a dielectric 402, a storage node 404, a first electrode or bottom electrode 408, one or more second electrodes such as an electrode 406, and a selector node 410. Storage node 404 can be stacked on top of bottom electrode 408. Bottom electrode 408 can be the same as bottom electrode 108 shown in FIG. 1A, or other bottom electrodes described herein. Storage node 404 can be the same as storage node 104 shown in FIG. 1A, or other storage nodes described herein. Selector node 410 can be electrically coupled to storage node 404 through bottom electrode 408. Selector node 410 be the same as selector 110 shown in FIG. 1A, or other selector nodes described herein.

Electrode 406 can be disposed on top of dielectric 402, on the sides of dielectric 402, the on the sides of storage node 404. Electrode 406 can be composed of the same materials as electrodes 106a, 106b shown in FIG. 1A, or other electrodes described herein. To reduce threshold voltage $V_{TH}$ while increasing amorphous volume $u_a$, one or more film layers such as threshold voltage reduction layers 412a, 412b can be positioned in memory cell 400 to reduce threshold voltage $V_{TH}$ and change a distribution of the electric field generated by voltage V inside storage node 404. Threshold voltage reduction layers 412a, 412b can be composed of the same materials as threshold voltage reduction layer 112 shown in FIG. 1A, or other threshold voltage reduction layers described herein. Storage node 404 can be bounded by bottom electrode 408, electrode 406, threshold voltage reduction layers 412a, 412b, and dielectric 402.

The position of the threshold reduction layers 412a, 412b, in memory cell 400, with respect to the bottom electrode 408 and electrode 406 can change the distribution of electric field generated by voltage V. By way of example the electric field being generated in storage node 404 can point from bottom electrode 408 towards electrode 406 bounding storage node 404 and towards threshold voltage reduction layers 412a, 412b. Note that threshold voltage reduction layers 412a, 412b forms an opening where dielectric 402 interfaces with storage node 404. Thus, current can also flow from bottom electrode 408 towards electrode 406 through the opening and dielectric 402. Without threshold voltage reduction layers 412a, 412b, the electric field being formed in storage node 404 may point toward electrode 406 through storage node 404 and dielectric 402, which may create scattered and small amorphous regions having non-uniform shape. Threshold voltage reduction layers 412a, 412b create electric field over a relatively larger amorphous region.

Figure 5:
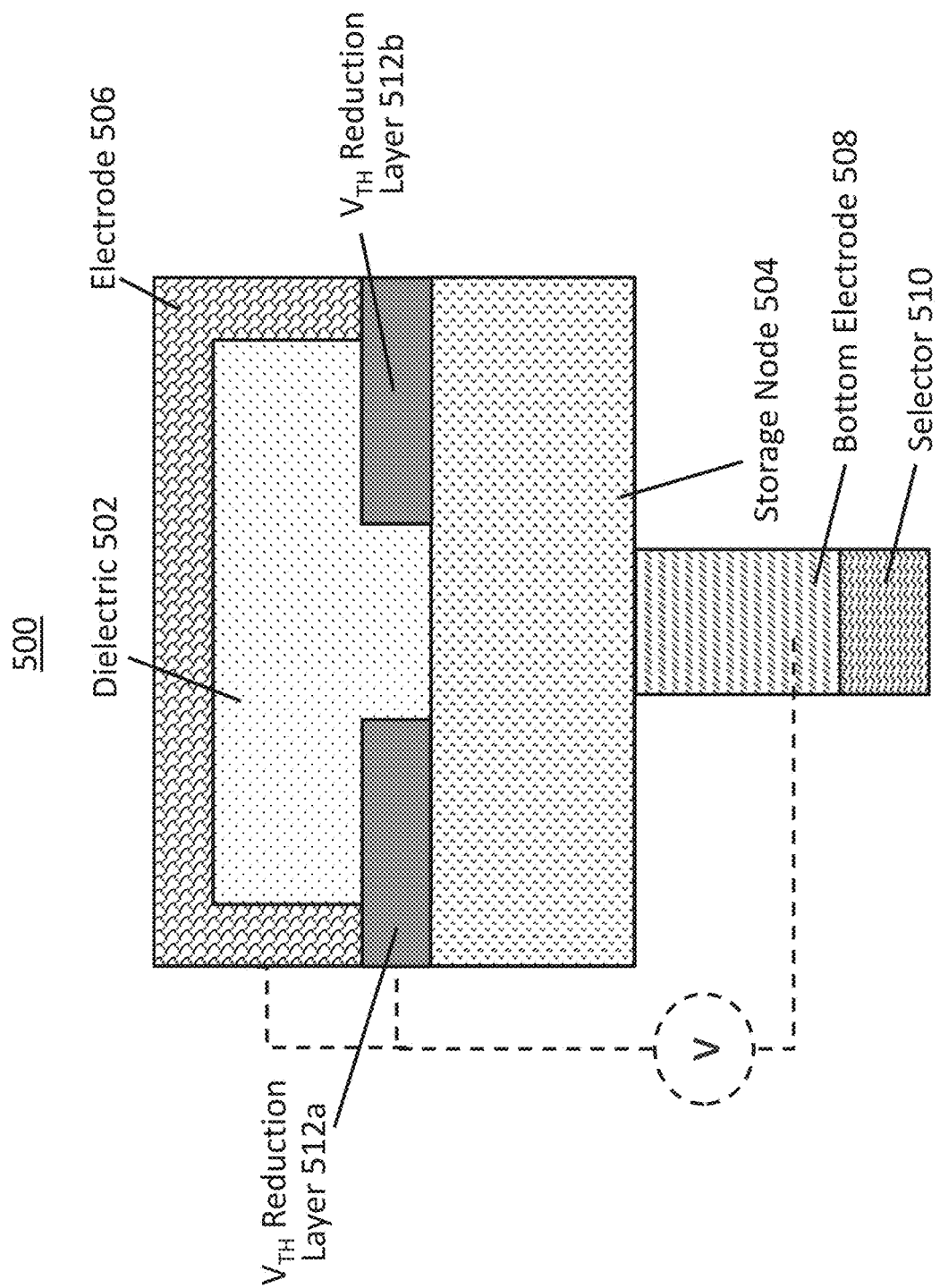
FIG. 5 is a diagram illustrating a cross sectional view of another memory cell with reduced threshold voltage in one embodiment.

FIG. 5 is a diagram illustrating a cross sectional view of another memory cell with reduced threshold voltage in one embodiment. Another semiconductor device, or memory cell 500, is shown in FIG. 5. Memory cell 500 can be a PCM-based non-volatile memory cell. Memory cell 500 can include components arranged in a stack configuration, such as at least a dielectric 502, a storage node 504, a first electrode or bottom electrode 508, one or more second electrodes such as an electrode 506, and a selector node 510. Storage node 504 can be stacked on top of bottom electrode 508. Bottom electrode 508 can be the same as bottom electrode 108 shown in FIG. 1A, or other bottom electrodes described herein. Storage node 504 can be the same as storage node 104 shown in FIG. 1A, or other storage nodes described herein. Selector node 510 can be electrically coupled to storage node 504 through bottom electrode 508. Selector node 510 be the same as selector 110 shown in FIG. 1A, or other selector nodes described herein.

Electrode 506 can be disposed on top of dielectric 502 and on the sides of dielectric 502. Electrode 506 can be disconnected from storage node 504. Electrode 506 can be composed of the same materials as electrodes 106a, 106b shown in FIG. 1A, or other electrodes described herein. To reduce threshold voltage $V_{TH}$ while increasing amorphous volume $u_a$, one or more film layers such as threshold voltage reduction layers 512a, 512b can be positioned in memory cell 500 to reduce threshold voltage $V_{TH}$ and change a distribution of the electric field generated by voltage V inside storage node 504. Threshold voltage reduction layers 512a, 512b can be composed of the same materials as threshold voltage reduction layer 112 shown in FIG. 1A, or other threshold voltage reduction layers described herein. Storage node 504 can be bounded by bottom electrode 508, threshold voltage reduction layers 512a, 512b, and dielectric 502.

The position of the threshold reduction layers 512a, 512b, in memory cell 500, with respect to the bottom electrode 508 and electrode 506 can change the distribution of electric field generated by voltage V. By way of example, the electric field being generated in storage node 504 can point from bottom electrode 508 toward threshold voltage reduction layers 512a, 512b. Note that threshold voltage reduction layers 512a, 512b forms an opening where dielectric 502 interfaces with storage node 504. Without threshold voltage reduction layers 512a, 512b, the electric field being formed in storage node 504 may remain localized to the edge of the electrode 508, which may create scattered and small amorphous regions having non-uniform shape. Threshold voltage reduction layers 512a, 512b can allow for a homogenous and spread-out electric field over the amorphous volume.

Figure 6:
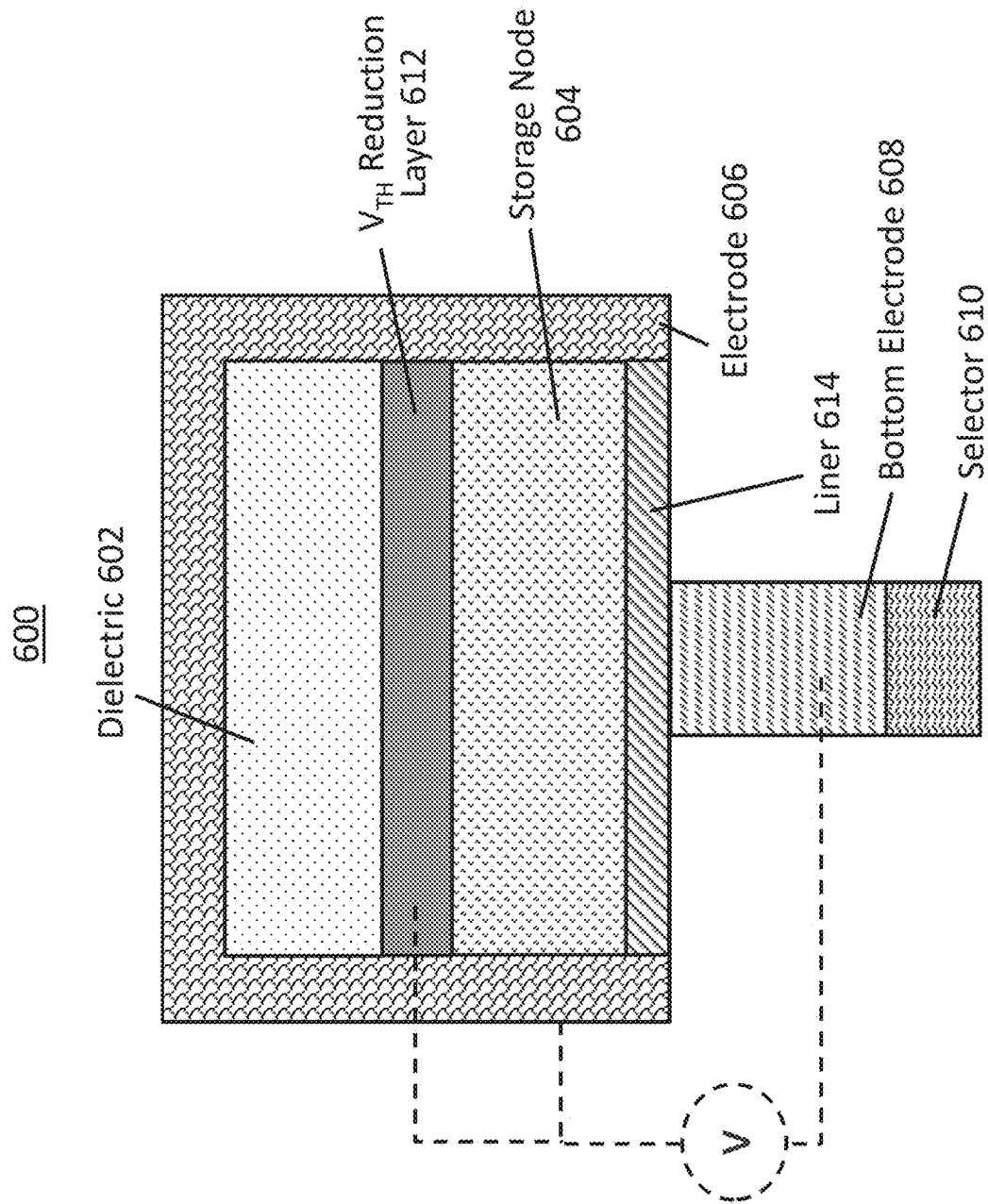
FIG. 6 is a diagram illustrating a cross sectional view of another memory cell with reduced threshold voltage in one embodiment.

FIG. 6 is a diagram illustrating a cross sectional view of another memory cell with reduced threshold voltage in one embodiment. Another semiconductor device, or memory cell 600, is shown in FIG. 6. Memory cell 600 can be a PCM-based non-volatile memory cell. Memory cell 600 can include components arranged in a stack configuration, such as at least a dielectric 602, a storage node 604, a first electrode or bottom electrode 608, one or more second electrodes such as an electrode 606, and a selector node 610. Storage node 604 can be stacked on top of bottom electrode 608. Bottom electrode 608 can be the same as bottom electrode 108 shown in FIG. 1A, or other bottom electrodes described herein. Storage node 604 can be the same as storage node 104 shown in FIG. 1A, or other storage nodes described herein. Selector node 610 can be electrically coupled to storage node 604 through bottom electrode 608. Selector node 610 be the same as selector 110 shown in FIG. 1A, or other selector nodes described herein.

Electrode 606 can be disposed on top of dielectric 602 and on the sides of dielectric 602. Electrode 606 can be composed of the same materials as electrodes 106a, 106b shown in FIG. 1A, or other electrodes described herein. To reduce threshold voltage $V_{TH}$ while increasing amorphous volume $u_a$, a film layer labeled as threshold voltage reduction layer 612 can be positioned in memory cell 600 to reduce threshold voltage $V_{TH}$ and change a distribution of the electric field generated by voltage V inside storage node 604. Threshold voltage reduction layer 612 can be composed of the same materials as threshold voltage reduction layer 112 shown in FIG. 1A, or other threshold voltage reduction layers described herein. Storage node 604 can be bounded by bottom electrode 608, electrode 606 and threshold voltage reduction layer 612.

The position of the threshold reduction layer 612, in memory cell 600, with respect to the bottom electrode 608 and electrode 606 can change the distribution of electric field generated by voltage V. By way of example, the electric field being generated in storage node 604 can point from bottom electrode 608 towards threshold voltage reduction layer 612. Without threshold voltage reduction layer 612, the electric field being formed in is localized, which may create scattered and small amorphous regions having non-uniform shape. Threshold voltage reduction layer 612 can allow for a homogenous and spread-out electric field over the amorphous volume.

Memory cell 600 shown in FIG. 6 can be a projected PCM memory cell that further includes a projection layer or liner 614. For projected PCM memory devices such as memory cell 600, in each resistance state (e.g., high resistive amorphous phase and low resistive crystalline phase), the resistance of threshold voltage reduction layer 112 ($R_{VTH}$) is less than the resistance of the amorphous phase ($R_a$) but greater than the resistance of the projection layer ($R_p$), and $R_p$ is greater than the resistance of the crystalline phase (Rc). In other words, $R_a > R_{VTH} > R_p > R_c$. By way of example, $R_a = \beta \times R_{VTH}$, $R_c = \alpha \times R_{VTH}$ and $R_p = \gamma \times R_{VTH}$, where $\alpha < \gamma < \beta$.

In an aspect, a range of resistance values that can be distinguished between the amorphous and crystalline states can be referred to as dynamic range. Larger dynamic range can enable the representation of more distinct data states, allowing for higher data density, more precise storage, retrieval of information, and allowing storage of multi-level or multi-bit data per memory cell to increase the overall storage capacity of the device. In one embodiment, liner 614 can help to prevent the dynamic range of memory cell 600 from being altered.

A sheet resistance of threshold voltage reduction layer 612 can be greater than the sheet resistance of liner 614 to prevent having a second pathway for projection (e.g., the second pathway being threshold voltage reduction layer 612) that can cause a reduction in the dynamic range. The sheet resistance of threshold voltage reduction layer 612 can be approximated to match the dynamic range of memory cell 600. For example, the sheet resistance of threshold voltage reduction layer 612 can double the sheet resistance of liner 614. In one embodiment, the materials composing threshold voltage reduction layer 612 and liner 614 can be the same materials. In one embodiment, to reduce a projection efficacy by threshold voltage reduction layer 612, thicker PCM film or a PCM with highly resistive amorphous phase can be used for forming storage node 604.

Figure 7:
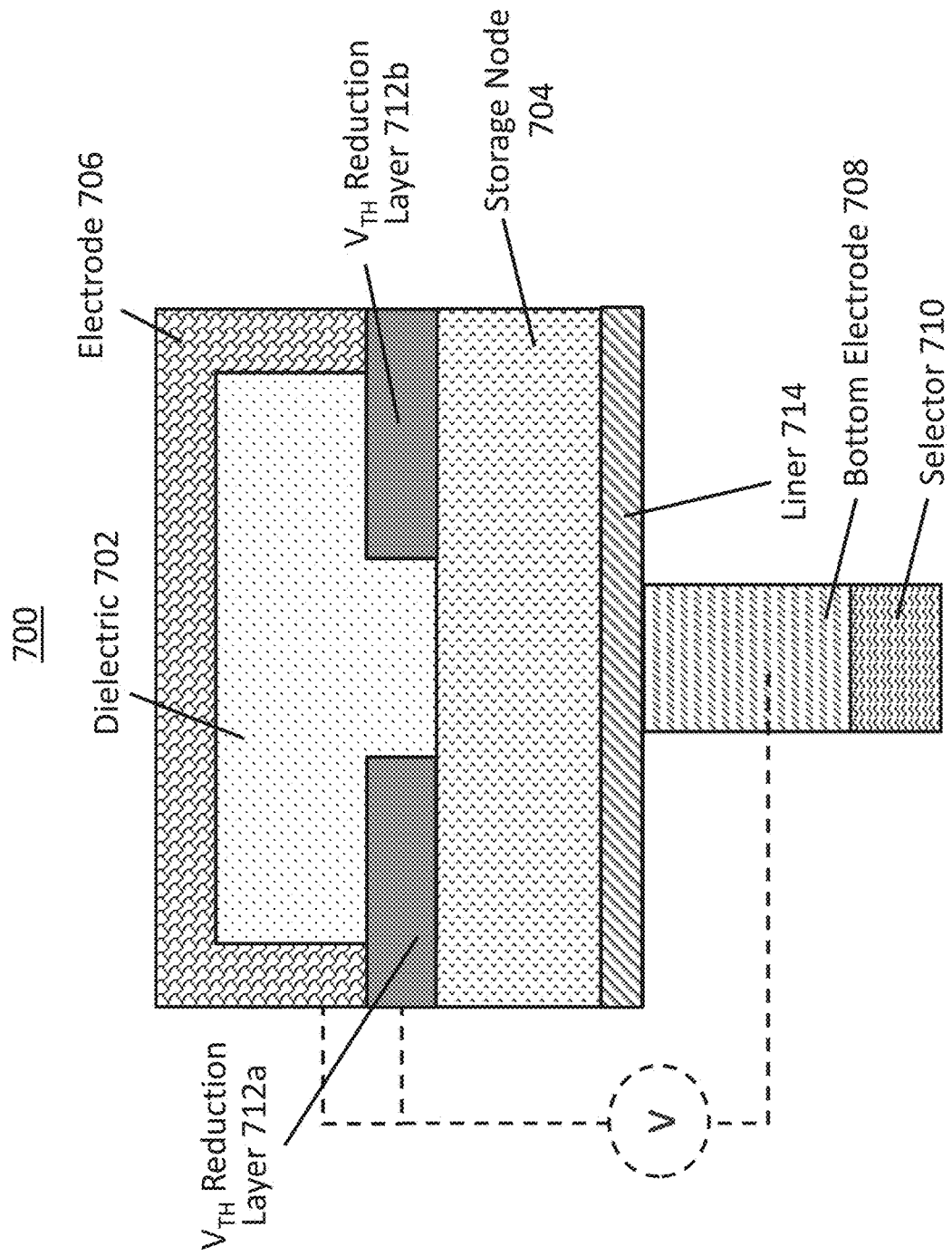
FIG. 7 is a diagram illustrating a cross sectional view of another memory cell with reduced threshold voltage in one embodiment.

FIG. 7 is a diagram illustrating a cross sectional view of another memory cell with reduced threshold voltage in one embodiment. Another semiconductor device, or memory cell 700, is shown in FIG. 7. Memory cell 700 can be a PCM-based non-volatile memory cell. Memory cell 700 can include components arranged in a stack configuration, such as at least a dielectric 702, a storage node 704, a first electrode or bottom electrode 708, one or more second electrodes such as an electrode 706, and a selector node 710. Storage node 704 can be stacked on top of bottom electrode 708. Bottom electrode 708 can be the same as bottom electrode 108 shown in FIG. 1A, or other bottom electrodes described herein. Storage node 704 can be the same as storage node 104 shown in FIG. 1A, or other storage nodes described herein. Selector node 710 can be electrically coupled to storage node 704 through bottom electrode 708. Selector node 710 be the same as selector 110 shown in FIG. 1A, or other selector nodes described herein.

Electrode 706 can be disposed on top of dielectric 702 and on the sides of dielectric 702. Electrode 706 can be disconnected from storage node 704. Electrode 706 can be composed of the same materials as electrodes 106a, 106b shown in FIG. 1A, or other electrodes described herein. To reduce threshold voltage $V_{TH}$ while increasing amorphous volume $u_a$, one or more film layers such as threshold voltage reduction layers 712a, 712b can be positioned in memory cell 700 to reduce threshold voltage $V_{TH}$ and change a distribution of the electric field generated by voltage V inside storage node 704. Threshold voltage reduction layers 712a, 712b can be composed of the same materials as threshold voltage reduction layer 112 shown in FIG. 1A, or other threshold voltage reduction layers described herein. Storage node 704 can be bounded by bottom electrode 708, threshold voltage reduction layers 712a, 712b, and dielectric 702.

The position of the threshold reduction layers 712a, 712b, in memory cell 700, with respect to the bottom electrode 708 and electrode 706 can change the distribution of electric field generated by voltage V. By way of example, charges of an electric field being generated in storage node 704 can move from bottom electrode 708 toward threshold voltage reduction layers 712a, 712b. Note that threshold voltage reduction layers 712a, 712b forms an opening where dielectric 702 interfaces with storage node 704. Thus, charges can also move from bottom electrode 708 towards electrode 706 through the opening and dielectric 702. Without threshold voltage reduction layers 712a, 712b, charges of the electric field being formed in storage node 704 may move toward electrode 706 through storage node 704 and dielectric 702, which may create scattered and small amorphous regions having non-uniform shape. Threshold voltage reduction layers 712a, 712b can reduce the area in which the charges move thus creating a relatively mode uniform amorphous region.

Memory cell 700 shown in FIG. 7 can be a projected PCM memory cell that further includes a projection layer or liner 714. Liner 714 can help to prevent the dynamic range of memory cell 700 from being altered. A sheet resistance of threshold voltage reduction layer 712 can be greater than the sheet resistance of liner 714 to prevent having a second pathway for projection (e.g., the second pathway being threshold voltage reduction layer 712) that can cause a reduction in the dynamic range. The sheet resistance of threshold voltage reduction layer 712 can be approximated to match the dynamic range of memory cell 700. In one embodiment, the materials composing threshold voltage reduction layer 712 and liner 714 can be the same materials.

In one embodiment, to reduce a projection efficacy by threshold voltage reduction layer 712, thicker PCM film or a PCM with highly resistive amorphous phase can be used for forming storage node 704.

Figure 8A:
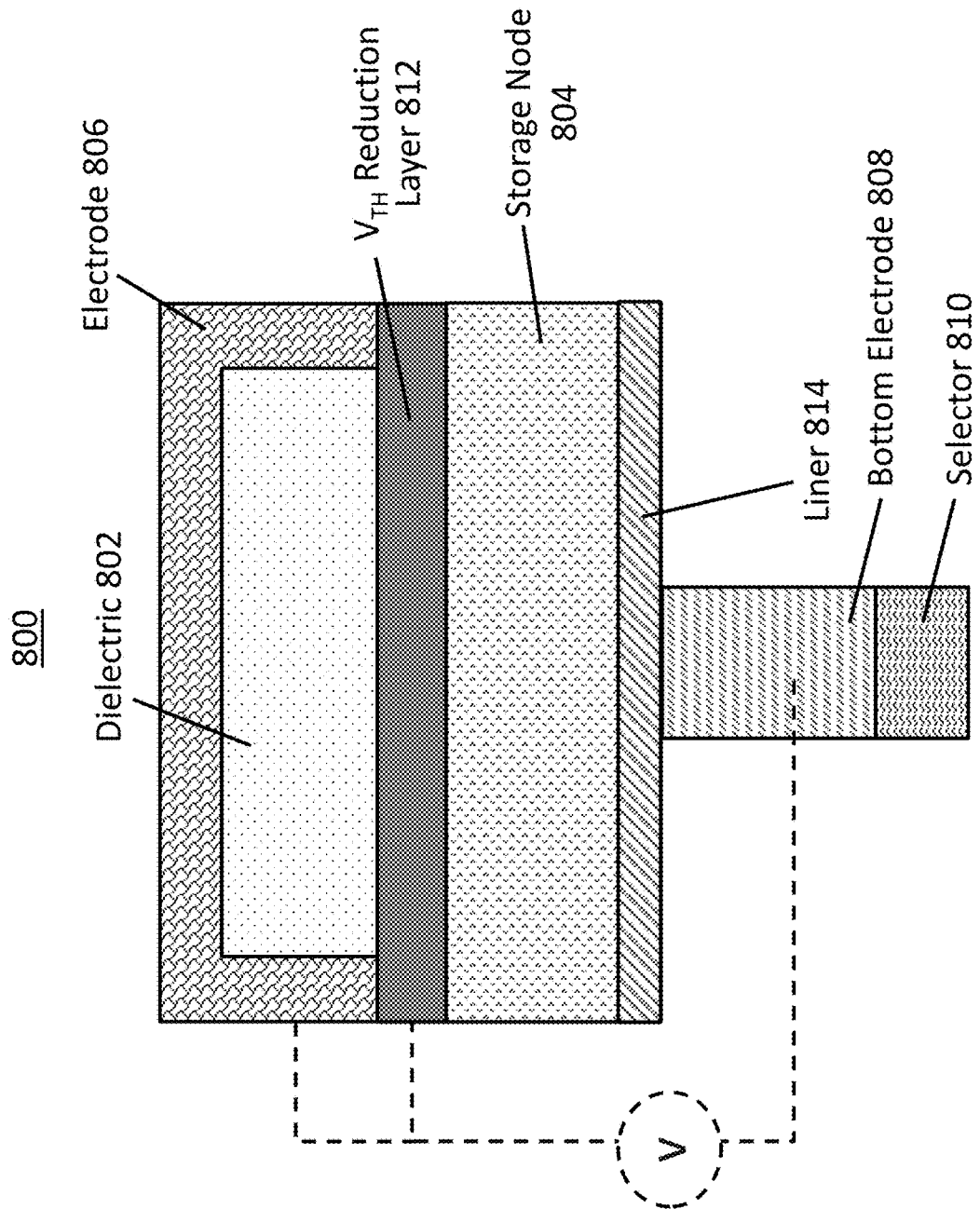
FIG. 8A is a diagram illustrating a cross sectional view of another memory cell with reduced threshold voltage in one embodiment.

FIG. 8A is a diagram illustrating a cross sectional view of another memory cell with reduced threshold voltage in one embodiment. Another semiconductor device, or memory cell 800, is shown in FIG. 8A. Memory cell 800 can be a PCM-based non-volatile memory cell. Memory cell 800 can include components arranged in a stack configuration, such as at least a dielectric 802, a storage node 804, a first electrode or bottom electrode 808, one or more second electrodes such as an electrode 806, and a selector node 810. Storage node 804 can be stacked on top of bottom electrode 808. Bottom electrode 808 can be the same as bottom electrode 108 shown in FIG. 1A, or other bottom electrodes described herein. Storage node 804 can be the same as storage node 104 shown in FIG. 1A, or other storage nodes described herein. Selector node 8210 can be electrically coupled to storage node 804 through bottom electrode 808. Selector node 810 be the same as selector 110 shown in FIG. 1A, or other selector nodes described herein.

Electrode 806 can be disposed on top of dielectric 802 and on the sides of dielectric 802. Electrode 806 can be disconnected from storage node 804. Electrode 806 can be composed of the same materials as electrodes 106a, 106b shown in FIG. 1A, or other electrodes described herein. To reduce threshold voltage $V_{TH}$ while increasing amorphous volume $u_a$, a film layer labeled as threshold voltage reduction layer 812 can be positioned in memory cell 800 to reduce threshold voltage $V_{TH}$ and change a distribution of the electric field generated by voltage V inside storage node 804. Threshold voltage reduction layer 812 can be composed of the same materials as threshold voltage reduction layer 112 shown in FIG. 1A, or other threshold voltage reduction layers described herein. Storage node 804 can be bounded by bottom electrode 808 and threshold voltage reduction layer 812.

The position of the threshold reduction layer 812, in memory cell 800, with respect to the bottom electrode 808 and electrode 806 can change the distribution of electric field generated by voltage V. By way of example, charges of an electric field being generated in storage node 804 can move from bottom electrode 808 towards threshold voltage reduction layer 812. Without threshold voltage reduction layer 812, charges of the electric field being formed in storage node 804 may move toward electrode 806 through dielectric 802, which may create scattered and small amorphous regions having non-uniform shape. Threshold voltage reduction layer 812 can reduce the area in which the charges move thus creating a relatively mode uniform amorphous region.

Figure 8B:
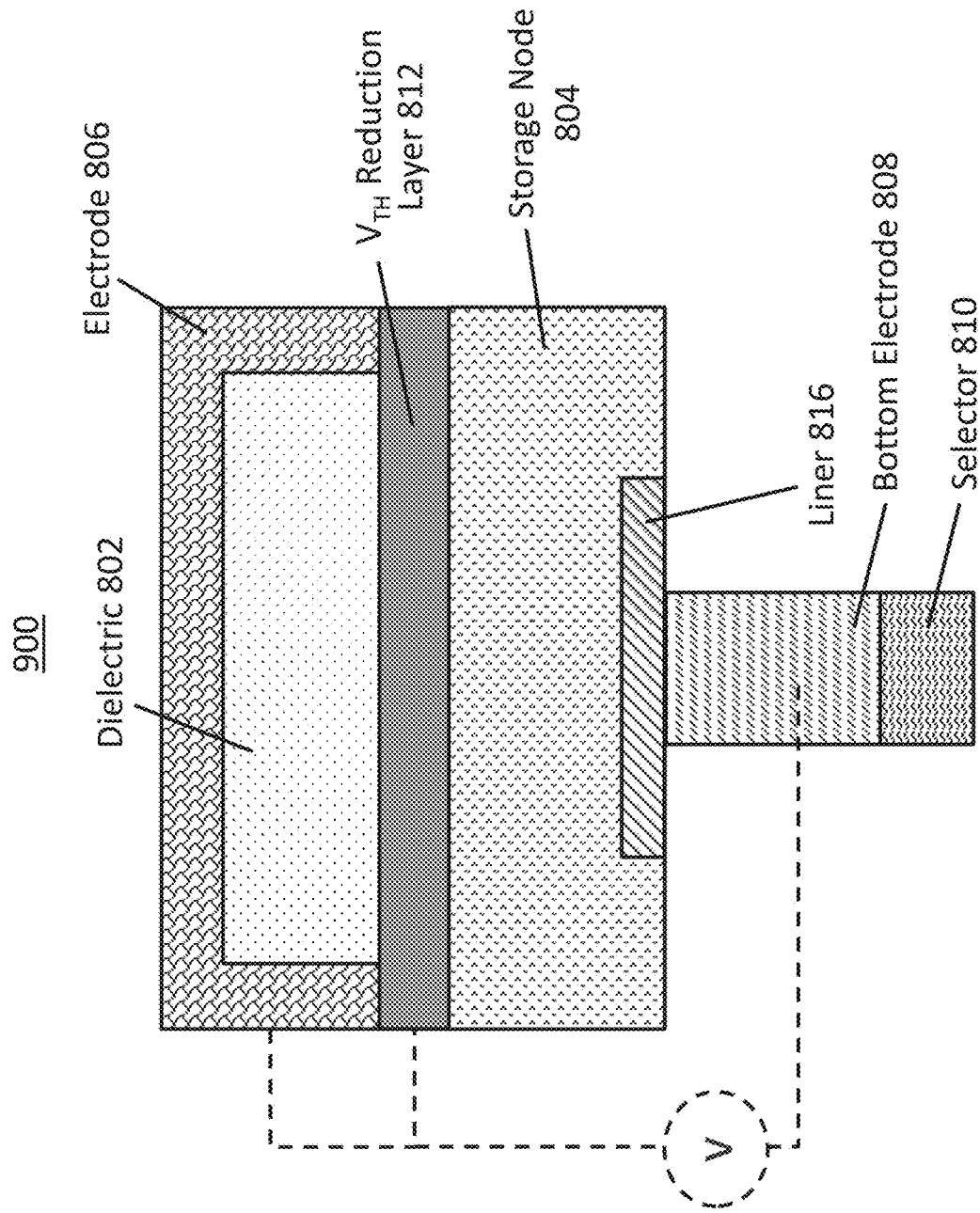
FIG. 8B is a diagram illustrating a variation of the memory cell shown in FIG. 8A in one embodiment.

Memory cell 800 shown in FIG. 8A can be a projected PCM memory cell that further includes a projection layer or liner 814. Liner 814 can help to prevent the dynamic range of memory cell 800 from being altered. A sheet resistance of threshold voltage reduction layer 812 can be greater than the sheet resistance of liner 814 to prevent having a second pathway for projection (e.g., the second pathway being threshold voltage reduction layer 812) that can cause a reduction in the dynamic range. The sheet resistance of threshold voltage reduction layer 812 can be approximated to match the dynamic range of memory cell 800. In one embodiment, the materials composing threshold voltage reduction layer 812 and liner 814 can be the same materials. In one embodiment, to reduce a projection efficacy by threshold voltage reduction layer 812, thicker PCM film or a PCM with highly resistive amorphous phase can be used for forming storage node 804. In another embodiment shown in FIG. 8B, a liner 816 can be stacked on bottom electrode 808 and liner 816 may be laterally smaller than liner 814 in FIG. 8A.

Figure 9:
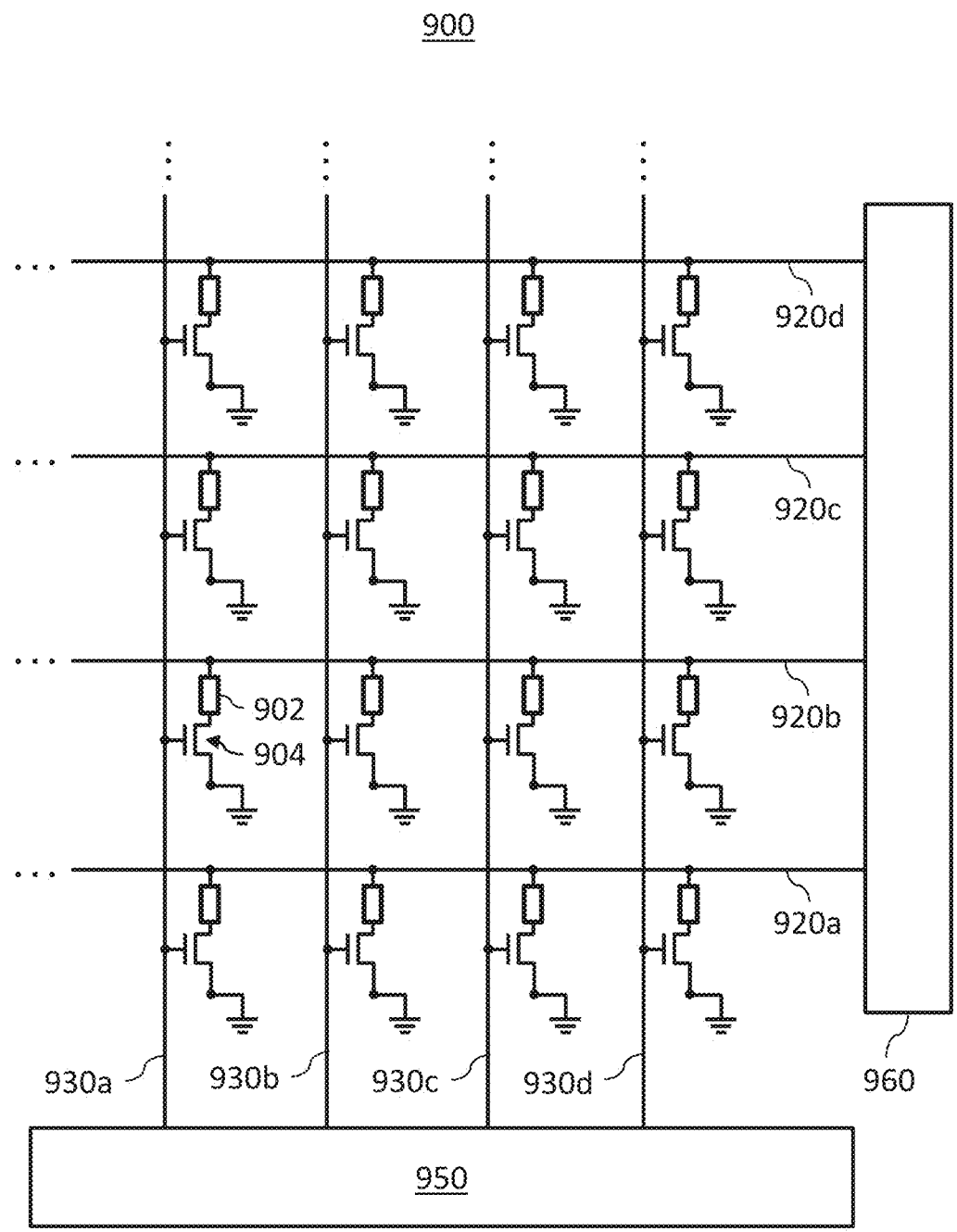
FIG. 9 is a diagram illustrating an example device that includes a plurality of memory cells with reduced threshold voltage in one embodiment.

FIG. 9 is a diagram illustrating an example cross-point memory array that includes a plurality of memory cells with reduced threshold voltage in one embodiment. In one embodiment, a portion of a phase change memory device 900 can include a plurality of phase change memory elements, each phase change memory element can include a phase change memory cell 902 and a transistor 904. The phase change memory cell 902 can be, for example, one of the memory cells including a threshold voltage reduction layer as shown and described in FIG. 1A to FIG. 8B. The input and output of each phase change memory element are the gate and drain terminals of the transistor 904, respectively. In one embodiment, the transistors 904 can be arranged in a common source configuration, where the source terminal of the transistor 904 is coupled to a common voltage. In another embodiment, the source terminal of the transistor 904 can be coupled to ground. A plurality of word lines, such as 930a, 930b, 930c, 930d, can connect the gate terminals of the transistors 904 to a decoder 950. A plurality of bit lines, such as 920a, 920b, 920c, 920d, can connect the phase change memory cells 902 to a decoder 960. Reading or writing to phase change memory cells of the device 900 can be achieved by applying an appropriate voltage or current to corresponding word lines and another appropriate voltage or current to corresponding bit lines to induce a current through the phase change memory elements. The level and duration of the voltages or currents being applied is dependent upon the operation performed, such as a reading operation or a writing operation.

Figure 10:
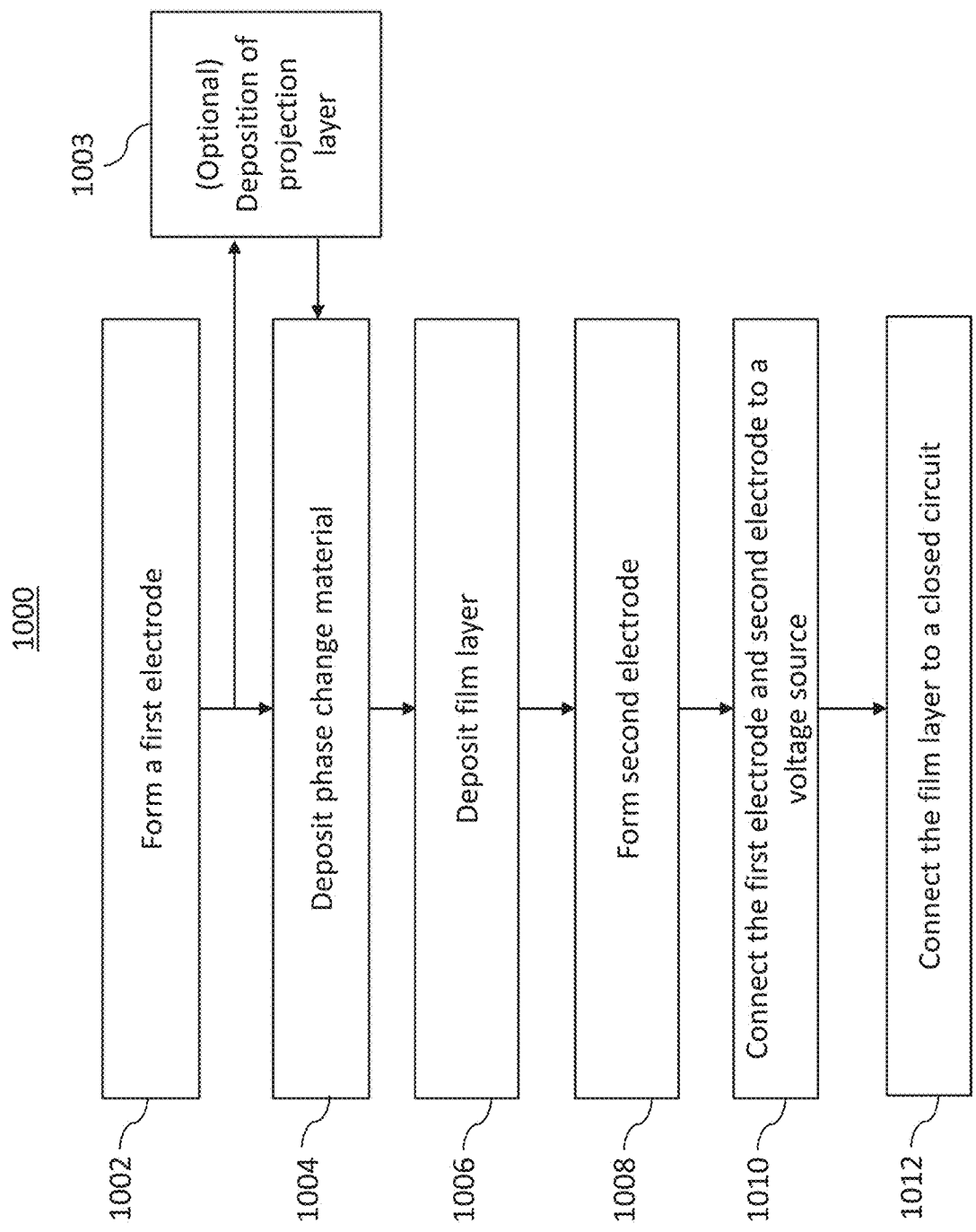
FIG. 10 is a flow diagram illustrating a method of forming a memory cell with reduced threshold voltage in one embodiment.

FIG. 10 is a flow diagram illustrating a method of forming a memory cell with reduced threshold voltage in one embodiment. An example process 1000 may include one or more operations, actions, or functions as illustrated by one or more of blocks 1002, 1004, 1006, 1008, 1010 and/or 1012. Although illustrated as discrete blocks, various blocks can be divided into additional blocks, combined into fewer blocks, eliminated, performed in different order, or performed in parallel, depending on the desired implementation.

The process 1000 can be performed to form a memory cell with a threshold voltage reduction layer, such as memory cells shown in FIG. 2 to FIG. 8B. The process 1000 can begin at block 1002. At block 1002, a first electrode can be formed. A thin layer of a conductive material, such as titanium nitride (TiN), can be deposited and patterned to form the first electrode. The process 1000 can proceed from block 1002 to block 1004. At block 1004, a layer of phase change material, such as GST, can be deposited on top of the first electrode.

Optionally, process 1000 can proceed from block 1002 to block 1003. At block 1003, a projection layer can be deposited on the first electrode. After depositing the projection layer on the first electrode, process 1000 can proceed from block 1003 to block 1004.

The process 1000 can proceed from block 1004 to block 1006. At block 1006, a film layer can be deposited on top of the layer of phase change materials. The film layer can function as a threshold voltage reduction layer described herein. The materials forming the film layer can be, for example, metal nitride. The process 1000 can proceed from block 1006 to block 1008. At block 1008, a second electrode can be formed on top of the film layer. A thin layer of a conductive material, such as titanium nitride (TiN), can be deposited and patterned to form the second electrode.

The process 1000 can proceed from block 1008 to block 1010. At block 1010, the first electrode and the second electrode can be connected to a voltage source. The process 1000 can proceed from block 1010 to block 1012. At block 1012, the film layer can be connected to a closed circuit to define a threshold voltage that triggers a phase change of the phase change material.

The formation, deposition and patterning in process 1000 can include deposition techniques such as physical vapor deposition (PVD) or chemical vapor deposition (CVD). In one embodiment, the first electrode can be formed on top of a selector node. Patterning can include using photolithography techniques that involves applying a photosensitive resist material, exposure to ultraviolet (UV) light through a mask that defines the desired pattern, and developing the resist to remove the exposed or unexposed areas. Etching (e.g., reactive ion etching (RIE)) can also be performed to selectively remove the unwanted materials and create the desired patterned structure.

Figure 11:
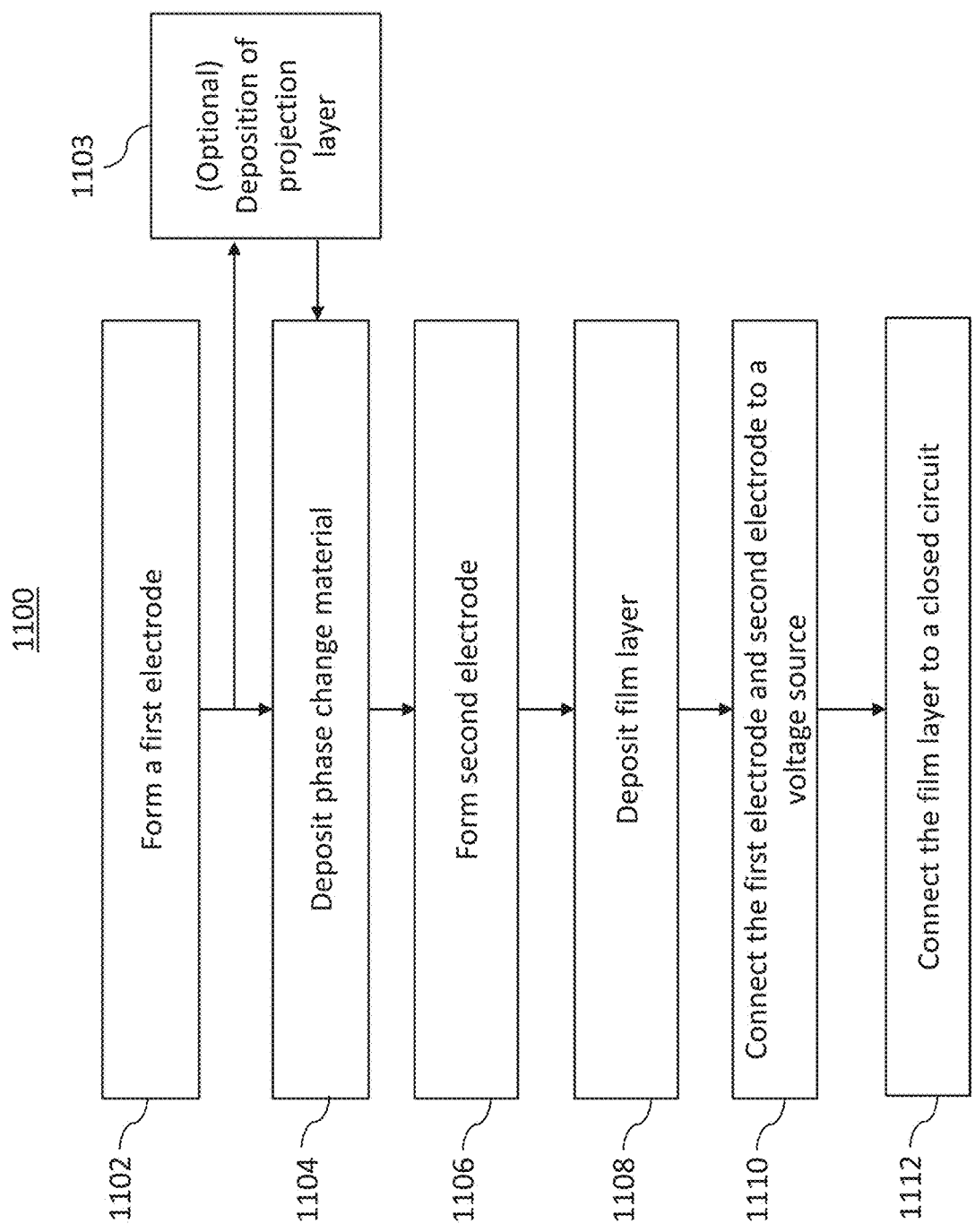
FIG. 11 is a flow diagram illustrating another method of forming a memory cell with reduced threshold voltage in one embodiment.

FIG. 11 is a flow diagram illustrating a method of forming a memory cell with reduced threshold voltage in one embodiment. An example process 1100 may include one or more operations, actions, or functions as illustrated by one or more of blocks 1102, 1104, 1106, 1108, 1110 and/or 1112. Although illustrated as discrete blocks, various blocks can be divided into additional blocks, combined into fewer blocks, eliminated, performed in different order, or performed in parallel, depending on the desired implementation.

The process 1100 can be performed to form a memory cell with a threshold voltage reduction layer, such as memory cell 100 shown in FIG. 1A. The process 1100 can begin at block 1102. At block 1102, a first electrode can be formed. A thin layer of a conductive material, such as titanium nitride (TiN), can be deposited and patterned to form the first electrode. The process 1100 can proceed from block 1102 to block 1104. At block 1104, a layer of phase change material, such as GST, can be deposited on top of the first electrode.

Optionally, process 1100 can proceed from block 1102 to block 1103. At block 1103, a projection layer can be deposited on the first electrode. After depositing the projection layer on the first electrode, process 1100 can proceed from block 1103 to block 1104.

The process 1100 can proceed from block 1104 to block 1106. At block 1106, a second electrode can be formed on top of the film layer. A thin layer of a conductive material, such as titanium nitride (TiN), can be deposited and patterned to form the second electrode. The process 1100 can proceed from block 1106 to block 1108. At block 1108, a film layer can be deposited on top of the layer of phase change materials. The film layer can function as a threshold voltage reduction layer described herein. The materials forming the film layer can be, for example, metal nitride.

The process 1100 can proceed from block 1108 to block 1110. At block 1110, the first electrode and the second electrode can be connected to a voltage source. The process 1100 can proceed from block 1110 to block 1112. At block 1112, the film layer can be connected to a closed circuit to define a threshold voltage that triggers a phase change of the phase change material.

The formation, deposition and patterning in process 1100 can include deposition techniques such as physical vapor deposition (PVD) or chemical vapor deposition (CVD). In one embodiment, the first electrode can be formed on top of a selector node. Patterning can include using photolithography techniques that involves applying a photosensitive resist material, exposure to ultraviolet (UV) light through a mask that defines the desired pattern, and developing the resist to remove the exposed or unexposed areas. Etching (e.g., reactive ion etching (RIE)) can also be performed to selectively remove the unwanted materials and create the desired patterned structure.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more instructions for implementing the specified logical function(s). In some alternative implementations, the functions noted in the blocks may occur out of the order noted in the Figures. For example, two blocks shown in succession may, in fact, be performed substantially concurrently, or the blocks may sometimes be performed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 12:
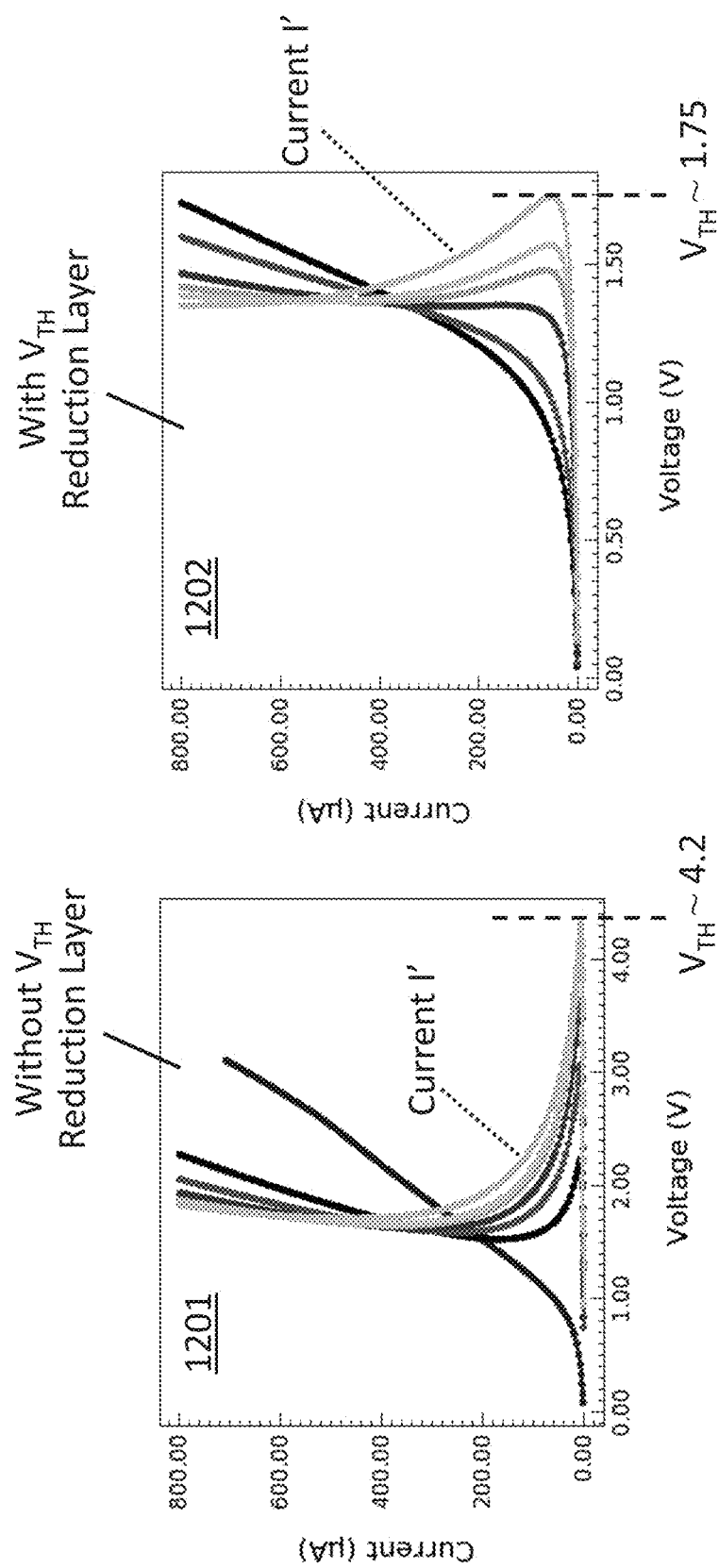
FIG. 12 is a diagram illustrating I-V characteristic curves relating to a memory cell with reduced threshold voltage in one embodiment.

FIG. 12 is a diagram illustrating I-V characteristic curves relating to a memory cell with reduced threshold voltage in one embodiment. An I-V characteristic curve 1201 and an I-V characteristic curve 1202 are shown in FIG. 12. I-V characteristic curve 1201 shows operation characteristics of a PCM device without a threshold reduction layer. I-V characteristic curve 1201 shows operation characteristics of a PCM device with a threshold reduction layer, such as the PCM memory cells shown in FIG. 1 to FIG. 8B. Comparing I-V characteristic curve 1201 with I-V characteristic curve 1202, threshold voltages of the PCM device without a threshold reduction layer is significantly higher than threshold voltages of the PCM device with a threshold reduction layer. By way of example, at a specific current I', I-V characteristic curve 1201 shows that the threshold voltage of the PCM device without a threshold reduction layer is approximately 4.2V while I-V characteristic curve 1202 shows the threshold voltage of the PCM device with a threshold reduction layer is approximately 1.75V.

Figure 13:
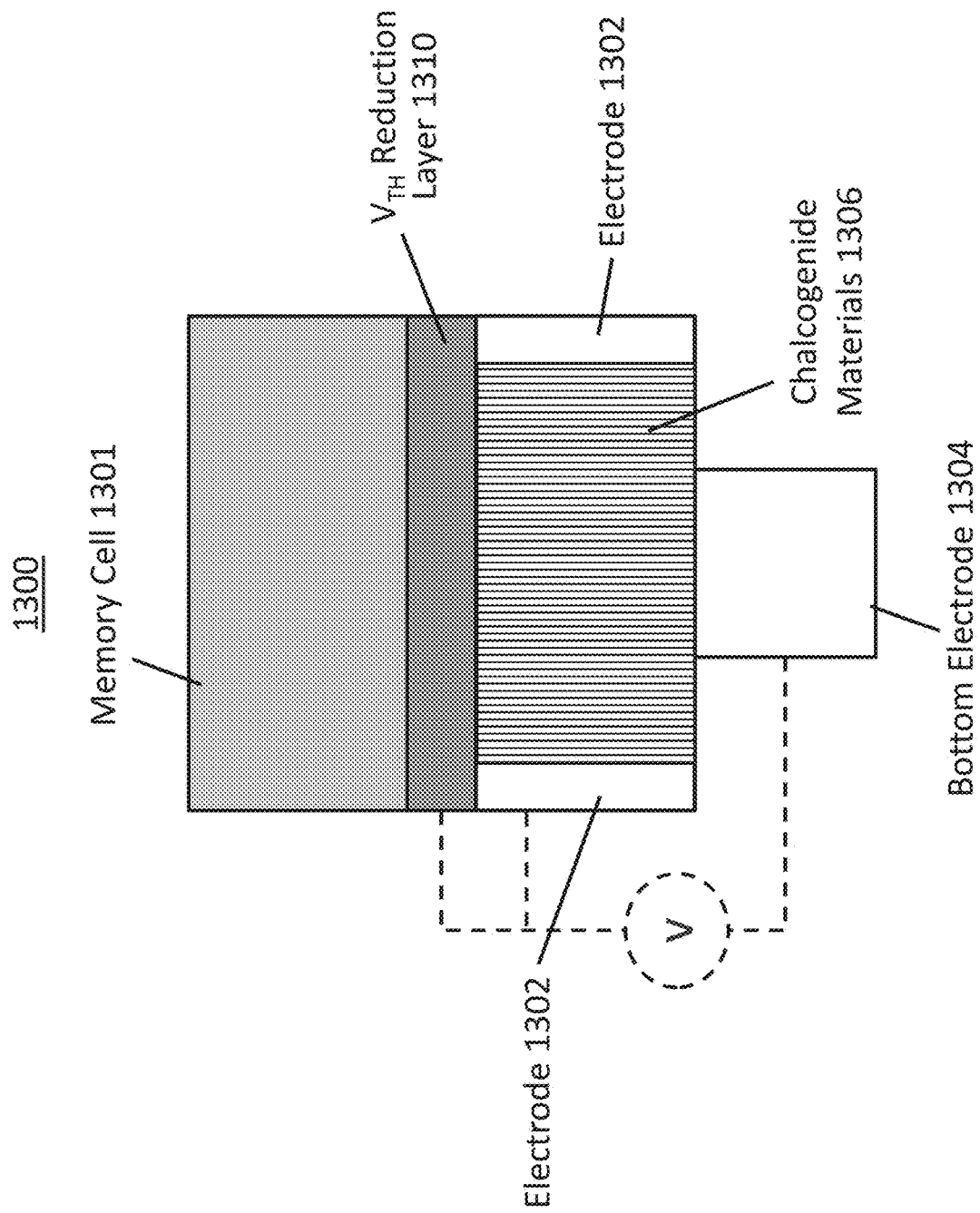
FIG. 13 is a diagram illustrating an example selector device that includes a threshold voltage reduction layer in one embodiment.

FIG. 13 is a diagram illustrating an example selector device that includes a threshold voltage reduction layer in one embodiment. A selector device 1300 is shown in FIG. 13. Selector device 1300 can be equivalent to selector nodes shown in FIG. 1 to FIG. 8B. A memory cell 1301 can be stacked on top of selector device 1300. Memory cell 1301 can be one of the memory cells shown in FIG. 1A to FIG. 8B. Selector device 1300 can include at least electrodes 1302, a bottom electrode 1304, a layer of chalcogenide materials 1306 and a threshold voltage reduction layer 1310. The layer of chalcogenide materials 1306 can be deposited on top of bottom electrode 1304. The layer of chalcogenide materials 1306 can be composed of, for example, compounds formed principally from chalcogen element atoms such as sulfur, selenium or tellurium. In one embodiment, the layer of chalcogenide materials 1306 can be a ovonic threshold switching chalcogenide layer. The threshold voltage reduction layer can be deposited on top of the layer of chalcogenide materials 1306 and situated between the later of chalcogenide materials 1306 and electrodes 1302.

The layer of chalcogenide material 1306 can be non-actively phased (e.g., between amorphous and crystalline phases). Depending on the voltage V being applied, the layer of chalcogenide materials 1306 can change between ON (conductive) and OFF (non-conductive) states. For example, the selector device 1300 can transition from an OFF state to an ON state in response to the voltage V exceeding threshold voltage $V_{TH}$. At the ON state, a conductive path can be formed between memory cell 1301 and bottom electrode 1304. When the voltage V falls below threshold voltage $V_TH$, the layer of chalcogenide materials 1306 can return to a non-conductive state (e.g., OFF state) and the conductive path no longer exists between memory cell 1301 and bottom electrode 1304.

In order to create a potential difference or voltage difference across threshold voltage reduction layer 1310, an electrical connection needs to be established to connect threshold voltage reduction layer 1310 in a closed electrical circuit. In one embodiment, threshold voltage reduction layer 1310 can be connected to electrodes 1302 and bottom electrode 1304 to form a closed circuit. In some embodiments, threshold voltage reduction layer 1310 can be connected to ground or to a voltage source (e.g., voltage V). The electrical connection of threshold voltage reduction layer 1310 in a closed circuit allows threshold voltage reduction layer 1310 to contribute to a voltage difference across selector device 1300 and reduce threshold voltage $V_TH$ of selector device 1300. The connection of threshold voltage reduction layer 1310 in a closed circuit can cause the transition of the layer of chalcogenide materials 1306 from the OFF state to the ON state to be relatively faster or earlier, thus reducing threshold voltage $V_{TH}$ of selector device 1300.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:
1. A semiconductor device comprising:
a first electrode;
a storage node including phase change material deposited on top of the first electrode;
a second electrode; and a film layer deposited on top of the storage node and connected in a closed circuit, wherein:
a voltage difference among the first electrode, the second electrode and the film layer dictates a threshold voltage that triggers a phase change of the phase change material; and
an amorphous volume in the storage node is dependent on a structural arrangement of the first electrode, the second electrode and the film layer with respect to the storage node.

2. The semiconductor device of claim 1, wherein in response to the phase change, an electric field is created in the storage node, a direction of the electric field is dependent on the structural arrangements of the first electrode, the second electrode and the film layer with respect to the storage node, and the amorphous volume is further dependent on the electric field.

3. The semiconductor device of claim 1, wherein the first electrode comprises a heating element configured to heat the phase change material in the storage node.

4. The semiconductor device of claim 1, wherein the film layer is composed of metal nitride.

5. The semiconductor device of claim 1, wherein:
an electrical resistance of the film layer is less than an electrical resistance of an amorphous phase of the storage node; and
the electrical resistance of the film layer is greater than an electrical resistance of a crystalline phase of the storage node.

6. The semiconductor device of claim 1, further comprising a projection layer positioned between the first electrode and the storage node.

7. The semiconductor device of claim 6, wherein:
an electrical resistance of the film layer is less than an electrical resistance of an amorphous phase of the storage node;
the electrical resistance of the film layer is greater than an electrical resistance of the projection layer;
the electrical resistance of the film layer is greater than an electrical resistance of a crystalline phase of the storage node; and
the electrical resistance of the projection layer is greater than the electrical resistance of the crystalline phase of the storage node.

8. The semiconductor device of claim 6, wherein a sheet resistance of the film layer is greater than a sheet resistance of the projection layer.

9. A memory device comprising:
a plurality of memory elements, each memory element among the plurality of memory elements comprises a memory cell, and the memory cell comprises:
a first electrode;
a storage node including phase change material deposited on top of the first electrode;
a second electrode; and
a film layer deposited on top of the storage node and connected in a closed circuit, wherein:
a voltage difference among the first electrode, the second electrode and the film layer dictates a threshold voltage that triggers a phase change of the phase change material; and
an amorphous volume in the storage node is dependent on a structural arrangement of the first electrode, the second electrode and the film layer with respect to the storage node.

10. The memory device of claim 9, wherein in response to the phase change, an electric field is created in the storage node, a direction of the electric field is dependent on the structural arrangements of the first electrode, the second electrode and the film layer with respect to the storage node, and the amorphous volume is further dependent on the electric field.

11. The memory device of claim 9, further comprising a selector node connected to the first electrode, wherein the selector node comprises:
a third electrode;
a fourth electrode;
a layer of chalcogenides deposited on top of the fourth electrode, wherein the layer of chalcogenides is bounded by the third electrode and the fourth electrode; and
another film layer deposited on top of the layer of chalcogenides.

12. The memory device of claim 9, wherein the film layer is composed of metal nitride.

13. The memory device of claim 9, wherein:
an electrical resistance of the film layer is less than an electrical resistance of an amorphous phase of the storage node; and
the electrical resistance of the film layer is greater than an electrical resistance of a crystalline phase of the storage node.

14. The memory device of claim 9, wherein the memory cell further comprises a projection layer between the first electrode and the storage node.

15. The memory device of claim 14, wherein:
an electrical resistance of the film layer is less than an electrical resistance of an amorphous phase of the storage node;
the electrical resistance of the film layer is greater than an electrical resistance of the projection layer;
the electrical resistance of the film layer is greater than an electrical resistance of a crystalline phase of the storage node; and
the electrical resistance of the projection layer is greater than the electrical resistance of the crystalline phase of the storage node.

16. The memory device of claim 14, wherein a sheet resistance of the film layer is greater than a sheet resistance of the projection layer.

17. A method comprising:
forming a first electrode;
depositing a layer of phase change material;
depositing a film layer;
forming a second electrode;
connecting the first electrode and the second electrode to a voltage source; and
connecting the film layer to a closed circuit to define a threshold voltage that triggers a phase change of the phase change material.

18. The method of claim 17, further comprising depositing a projection layer subsequent to forming the first electrode and prior to depositing the layer of phase change material.

19. The method of claim 17, wherein the film layer is composed of metal nitride.

20. The method of claim 17, further comprising depositing a dielectric layer on top of the second electrode.

* * * * *